US012362268B2

(12) United States Patent
Wang et al.

(10) Patent No.: US 12,362,268 B2
(45) Date of Patent: Jul. 15, 2025

(54) PACKAGE ASSEMBLY INCLUDING PACKAGE SUBSTRATE WITH ELONGATED SOLDER RESIST OPENING AND METHODS FOR FORMING THE SAME

(71) Applicant: Taiwan Semiconductor Manufacturing Company Limited, Hsinchu (TW)

(72) Inventors: Chin-Hua Wang, New Taipei (TW); Shu-Shen Yeh, Taoyuan (TW); Yu-Sheng Lin, Zhubei (TW); Po-Yao Lin, Zhudong Township (TW); Shin-Puu Zeng, Po-Shan Village, CA (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 606 days.

(21) Appl. No.: 17/749,397

(22) Filed: May 20, 2022

(65) Prior Publication Data

US 2023/0378036 A1 Nov. 23, 2023

(51) Int. Cl.
*H01L 23/498* (2006.01)
*H01L 21/48* (2006.01)
*H01L 23/00* (2006.01)
*H01L 25/065* (2023.01)

(52) U.S. Cl.
CPC .... *H01L 23/49811* (2013.01); *H01L 21/4853* (2013.01); *H01L 23/49833* (2013.01); *H01L 23/49838* (2013.01); *H01L 23/49866* (2013.01); *H01L 24/16* (2013.01); *H01L 24/32* (2013.01); *H01L 24/73* (2013.01); *H01L 25/0655* (2013.01); *H01L 2224/16235* (2013.01); *H01L 2224/32225* (2013.01); *H01L 2224/73204* (2013.01); *H01L 2924/3841* (2013.01)

(58) Field of Classification Search
None
See application file for complete search history.

(56) References Cited

U.S. PATENT DOCUMENTS

2007/0201193 A1\* 8/2007 Tsuji .................... H05K 3/3452
257/E21.503

\* cited by examiner

*Primary Examiner* — Kyoung Lee
(74) *Attorney, Agent, or Firm* — The Marbury Law Group, PLLC

(57) ABSTRACT

A package assembly includes a package substrate, a solder resist layer on the package substrate and including an elongated solder resist opening, and an interposer module on the package substrate and including a corner located on the elongated solder resist opening.

20 Claims, 17 Drawing Sheets

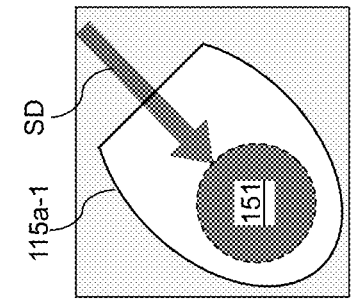
FIG. 3D
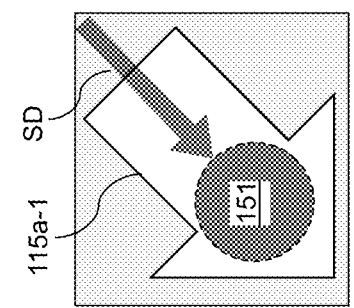
FIG. 3C
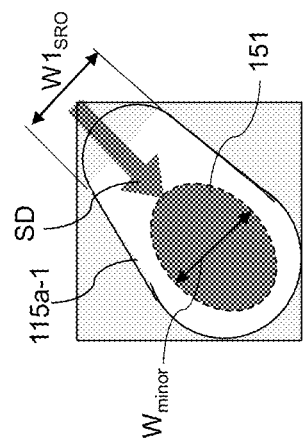
FIG. 4
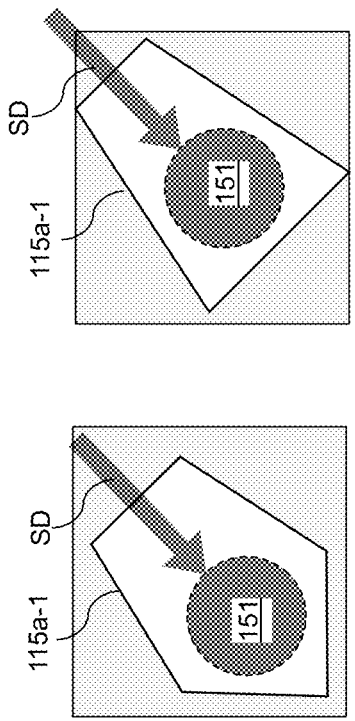
FIG. 3B
FIG. 3A

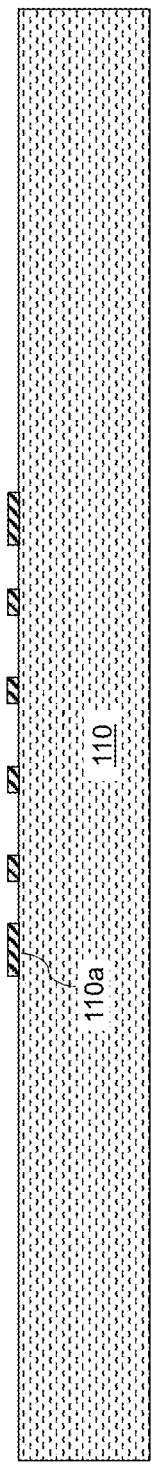
FIG. 5A
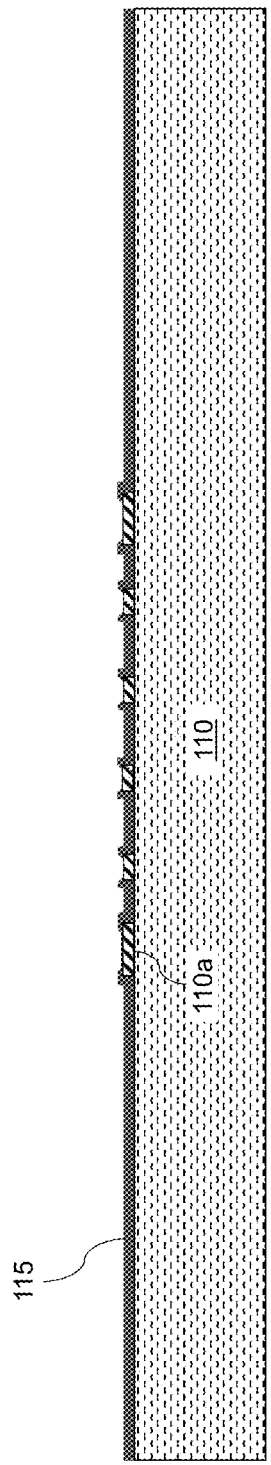
FIG. 5B
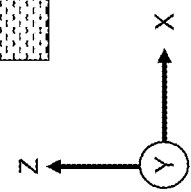

PACKAGE ASSEMBLY INCLUDING PACKAGE SUBSTRATE WITH ELONGATED SOLDER RESIST OPENING AND METHODS FOR FORMING THE SAME

BACKGROUND

A package assembly may include one or more semiconductor devices (e.g., semiconductor dies, interposer modules, etc.) that may be mounted on a substrate. The interposer module may be bonded to a package substrate by a plurality of bump structures (e.g., controlled-collapse chip-connection (C4) bump structures). The bump structures may include under bump metallization (UBM) on an interposer bonding pad and a solder joint between the UBM and the package substrate. The solder joint may be formed by a reflow process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A illustrates a first alternative design in which the first SRO has an elongated pentagon shape, according to one or more embodiments.

FIG. 3B illustrates a second alternative design in which the first SRO has an elongated trapezium shape, according to one or more embodiments.

FIG. 3C illustrates a third alternative design in which the first SRO has an arrow shape, according to one or more embodiments.

FIG. 3D illustrates a fourth alternative design in which the first SRO has a truncated ellipse shape, according to one or more embodiments.

FIG. 4 is a plan view of an alternative design of the UBM for a first SRO, according to one or more embodiments.

FIG. 5A is a vertical cross-sectional view of an exemplary intermediate structure after forming the bonding pads on the package substrate, according to one or more embodiments.

FIG. 5B is a vertical cross-sectional view of the exemplary intermediate structure after forming the solder resist layer on the package substrate, according to one or more embodiments.

DETAILED DESCRIPTION

Figure 1A:
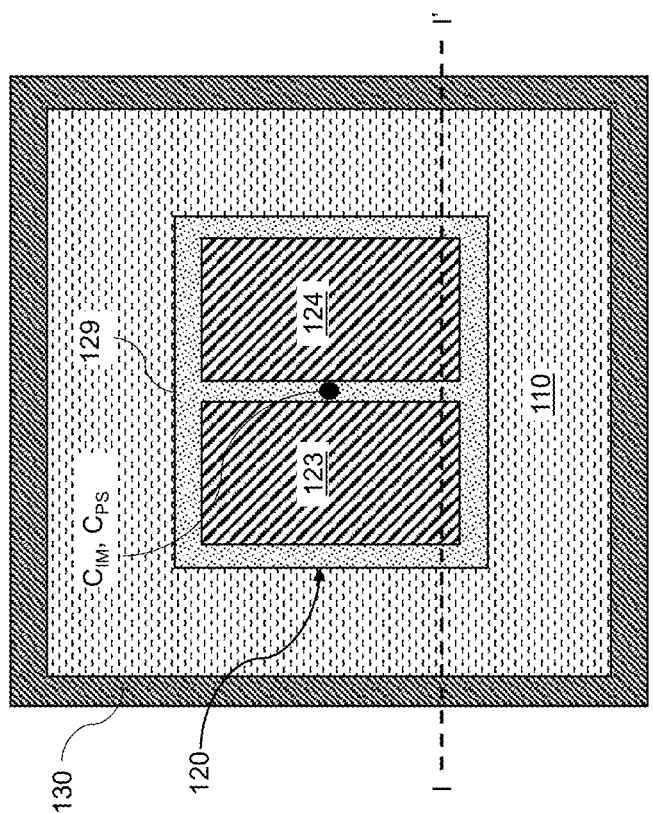
FIG. 1A is a plan view of a package assembly (e.g., organic/silicon interposer package) according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A package assembly may include one or more semiconductor devices (e.g., semiconductor dies, interposer modules, etc.) that may be mounted on a substrate. When constructing the package assembly, the interposer module may be bonded to a package substrate by a plurality of bump structures (e.g., controlled-collapse chip-connection (C4) bump structures). The bump structures may include under bump metallization (UBM) on an interposer bonding pad and a solder joint between the UBM and the package substrate. The solder joint may be formed by a reflow process. The reflow process may require the interposer module and package substrate to be heated to a high temperature. This high temperature may cause an expansion of the interposer module and the package substrate. Typically, a coefficient of thermal expansion (CTE) of the interposer module may be less than a CTE of the package substrate, making it difficult to properly align the UBM on the interposer module with the bonding pad on the package substrate.

To account for this difference in CTE, the interposer module may be designed with a "bump pre-shift." That is, the interposer module may include a "pre-shift design" in which a location of the UBM on the interposer module may be "shifted" so that it may be mis-aligned with the bonding pad before the solder joint is formed (e.g., before the reflow process) but properly aligned after the solder joint is formed (e.g., after the reflow process due to the thermal expansion).

Some package assemblies may experience problems associated with the use of a pre-shift design of the interposer module. For example, a distance in the pre-shift design may be insufficient. The insufficient distance in the pre-shift design may induce dislocations (e.g., mis-alignment) between the UBM and the package substrate bonding pad after a reflow process. A shift distance caused by thermal expansion may be non-uniform and subject to a distance to neutral point (DNP) effect on the substrate. That is, in the package substrate, a shift distance at an edge of the package substrate may be greater than a shift distance at a central portion of the package substrate. Similarly, in the interposer module, a shift distance at an edge of the interposer module may be greater than a shift distance at a central portion of the interposer module. As a result, dislocations caused by an insufficient pre-shift design may be common at a corner of the interposer module. Corner dislocations may be especially common in larger interposer modules (e.g., greater than about 2× reticle size). The dislocations may cause a deformed solder joint having a defective shape (e.g., necking-twist bump shape). The deformed solder joint may lead to a solder fatigue crack issue after a reliability thermal cycle test.

One or more embodiments of the present disclosure may include a package assembly (e.g., semiconductor package) including a package substrate, a solder resist layer (e.g., solder mask) on the package substrate and including an elongated solder resist opening (e.g., elongated solder recess), and an interposer module on the package substrate and including a corner located on the elongated solder resist opening (SRO). In such embodiments, a UBM at the corner of the interposer module may be aligned with a package substrate bonding pad through the elongated solder resist opening. Such configurations may help to ensure that the UBM may be properly aligned with the package substrate bonding pad (e.g., no dislocation issue) after the reflow process, so that a solder joint may be properly formed between the UBM and the package substrate bonding pad.

More particularly, one or more embodiments may provide an innovative solder resist opening (SRO) shape for a new bump scheme to mitigate solder joint (e.g., bump) crack risk. The SRO shape and bump scheme may be implemented in a package assembly including an interposer module with an organic dielectric or inorganic dielectric. The SRO shape may include, for example, an oblong-droplet shape instead of a traditional round (e.g., circular) shape that necessitated a pre-shift design at a corner of interposer package.

Various embodiments disclosed herein may provide several advantages over conventional package assemblies. Various embodiments may, for example, eliminate uncertainty in the alignment of the UBM of the interposer module and the SRO/package substrate bonding pad of the package substrate. Various embodiments may also provide a greater solder volume toward the DNP direction (e.g., a direction away from a central portion of the package substrate) which may further reduce solder joint fatigue risk after a reliability thermal cycle test.

One or more embodiments may include a package assembly. The package assembly may include, for example, one or more semiconductor dies or system-on-chip (SOC) devices. The package assembly may integrate homogeneous components (e.g., SoC and SoC) or heterogeneous components (SoC and memory). The package assembly may include an interposer module bonded to a package substrate. The interposer module may have a length $L_{IM}$ and a width $W_{IM}$. The interposer module may be bonded to the package substrate by a plurality of bump structures (e.g., C4 bump structures). The package substrate may include an elongated (e.g., oblong-droplet) SRO having a length $L_{SRO}$ in a longitudinal direction that is greater than a diameter $d_{UBM}$ of a UBM of a bump structure. The longitudinal direction of the SRO (e.g., longitudinal direction of the bump structure) may be parallel to a direction from a center of the interposer module to a center of the UBM in a projection plane of a bottom of the interposer module.

The elongated SRO may also include a first end that is closest to the central portion of the interposer module and has a first width $W1_{SRO}$, and a second end that is opposite the first end and has a second width $W2_{SRO}$. The first width $W1_{SRO}$, second width $W2_{SRO}$ and diameter $d_{UBM}$ may have the following relationship: $W2_{SRO} > W1_{SRO} \geq d_{UBM}$. In at least one embodiment, the first width $W1_{SRO}$, second width $W2_{SRO}$ and diameter $d_{UBM}$ may have the following relationship: $L_{SRO} - d_{UBM} > 1$ μm and $W2_{SRO} - d_{UBM} > 1$ μm.

The elongated SRO may be located at a corner of the interposer module. The interposer module may oblong-droplet SRO may be contained within an area, for example, having an area length CL (along the length of the interposer module $L_{IM}$) and an area width CW (along the width of the interposer module $W_{IM}$). The area length CL and the length of the interposer module $L_{IM}$ may have the following relationship: 50 μm ≤ CL ≤ ½ $L_{IM}$. The area width CW and the width of the interposer module $W_{IM}$ may have the following relationship: 50 μm ≤ CW ≤ ½ $W_{IM}$.

FIG. 1A is a plan view of a package assembly 100 (e.g., organic/silicon interposer package) according to one or more embodiments. The package assembly 100 may include a package substrate 110 and an interposer module 120 on the package substrate 110. The interposer module 120 may include a first semiconductor device 123 and a second semiconductor device 124. A package underfill layer 129 may be formed between the interposer module 120 and the package substrate 110. A ring 130 (e.g., metal ring) may be bonded to the package substrate 110 around the interposer module 120.

As illustrated in FIG. 1A, a central portion of the interposer module 120 may be substantially aligned with a central portion of the package substrate 110. In particular, in the plan view, a center $C_{IM}$ of the interposer module 120 may be substantially aligned with a center $C_{PS}$ of the package substrate 110. Thus, a direction away from the central portion of the package substrate 110 may also be considered to mean a direction away from the central portion of the interposer module 120. In some embodiments, the interposer module 120 and the package substrate 110 may have the same number of sides and the same orientation. Thus, a line from the center $C_{PS}$ of the package substrate 110 to a corner of the package substrate 110 may intersect a corner of the interposer module 120. However, in other embodiments, the interposer module 120 and the package substrate may not have the same number of sides and the same orientation, and a line from the center $C_{PS}$ of the package substrate 110 to a corner of the package substrate 110 may not intersect a corner of the interposer module 120.

Figure 1B:
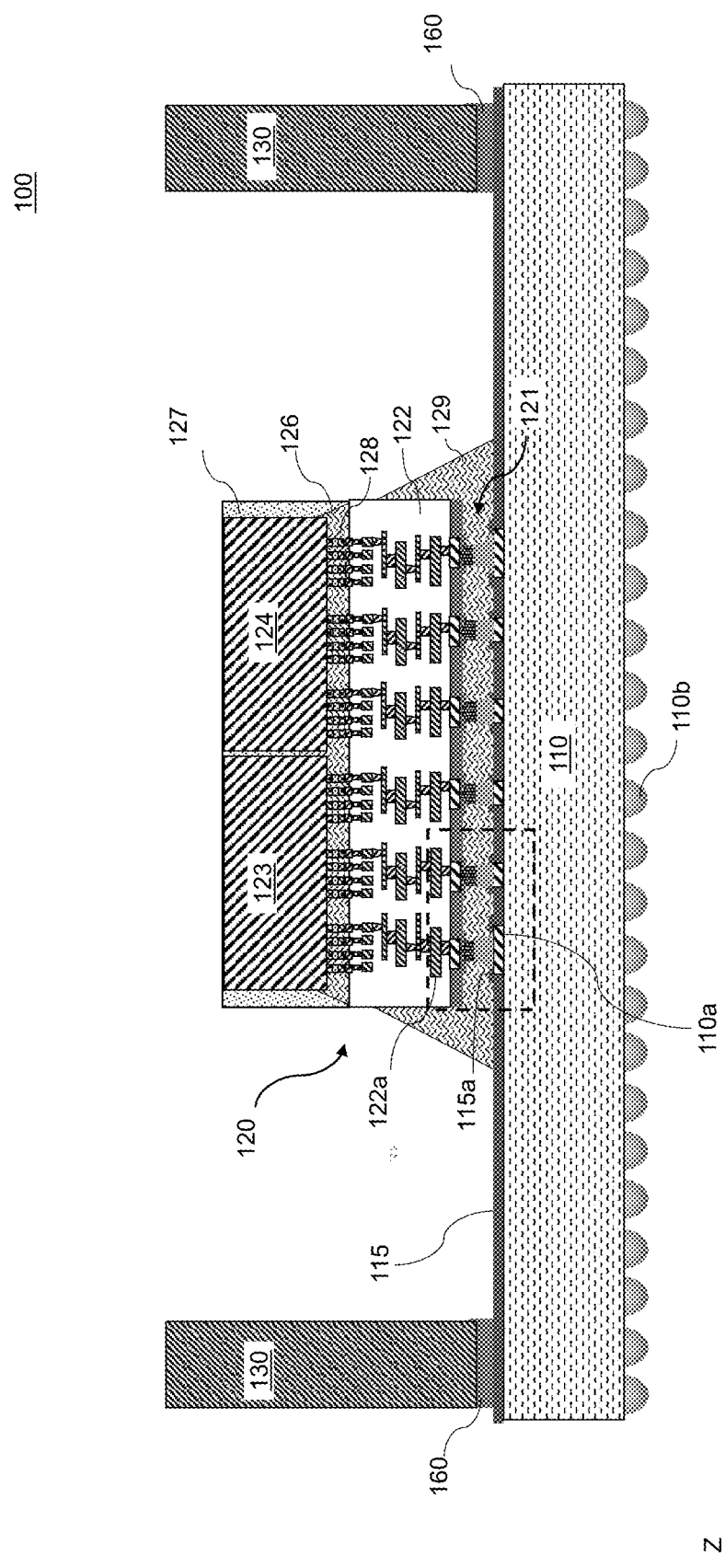
FIG. 1B is a vertical cross-sectional view of the package assembly along the cross-section I-I' in FIG. 1A, according to one or more embodiments.

FIG. 1B is a vertical cross-sectional view of the package assembly 100 along the cross-section I-I' in FIG. 1A, according to one or more embodiments. As illustrated in FIG. 1B, the package substrate 110 may include any substrate that may support a package assembly. For example, the package substrate 110 may include a system on integrated substrate (SoIS), a printed circuit board (PCB) etc. In one or more embodiments, the package substrate 110 may include a core substrate (e.g., polymer substrate), an upper insulating layer (e.g., chip-side insulating layer) formed on the core substrate, and a lower insulating layer (e.g., board-side insulating layer) formed on the core substrate opposite the upper insulating layer. The package substrate 110 may also include metal interconnects and through vias to provide an electrical connection of the package substrate 110.

The package substrate 110 may also include package substrate bonding pads 110a (e.g., package substrate contact pads) formed on a chip-side of the package substrate 110. The package substrate bonding pads 110a may be composed of copper or another suitable metal (e.g., silver, chromium, nickel, tin, tungsten, titanium, gold, etc.), a copper alloy, or other suitable metal alloy. The package substrate bonding pads 110a may be used to provide an electrical connection to the interposer module 120 or other semiconductor devices (e.g., semiconductor dies) that are mounted on the package substrate 110.

A ball-grid array (BGA) including a plurality of solder balls 110b may be formed on a board-side of the package substrate 110. The board-side of the package substrate 110 is opposite to the chip-side of the package substrate 110. The solder balls 110b may allow the package assembly 100 to be securely mounted on a substrate such as a printed circuit board (PCB) and electrically coupled to the substrate. The solder balls 110b may be electrically connected to the package substrate bonding pads 110a by the metal interconnects and through vias (not shown) in the package substrate 110.

A solder resist layer 115 (e.g., solder mask) may be formed on the chip-side surface of the package substrate 110. The solder resist layer 115 may include a thin layer of polymer material (e.g., epoxy polymer). The solder resist layer 115 may have a thickness in a range from about 5 µm to 50 µm. Greater or lesser thickness of the solder resist layer 115 may be used. The solder resist layer 115 may be formed so as to cover the package substrate bonding pads 110a and other metal features (e.g., conductive lines, copper traces) on the chip-side surface of the package substrate 110. The solder resist layer 115 may protect the package substrate bonding pads 110a and other metal features from oxidation. The solder resist layer 115 may also prevent solder bridges (e.g., unintended electrical connections) from forming between closely spaced metal features. The solder resist layer 115 may include solder resist openings (SROs) 115a over the package substrate bonding pads 110a, respectively. An upper surface of the package substrate bonding pads 110a may be exposed through the SROs 115a. The SROs 115a may have a tapered sidewall so that a diameter of the SRO 115a (in the X-Y plane) may decrease in a direction toward the package substrate bonding pad 110a.

The interposer module 120 may be connected (e.g., electrically connected) to the package substrate 110 by bump structures 121 (e.g., C4 bump structures). The bump structures 121 may connect the interposer module 120 to the package substrate bonding pads 110 through the SROs 115a in the solder resist layer 115.

The interposer module 120 may include an interposer dielectric layer 122 (e.g., interposer) that may be composed of silicon or an organic material (e.g., dielectric polymer material) such as polyimide (PI), benzocyclobutene (BCB), or polybenzobisoxazole (PBO). Other suitable materials are within the contemplated scope of disclosure. The interposer dielectric layer 122 include metal interconnects 122a (e.g., metal lines and metal vias) that may be electrically connected to the bump structures 121. The first semiconductor device 123 and second semiconductor device 124 may be mounted on the interposer dielectric layer 122. The first semiconductor device 123 and second semiconductor device 124 may be mounted on the interposer dielectric layer 122 by micro-bumps 128 that may be electrically connected to the metal interconnects 122a. A package underfill layer 129 may be formed under and around the interposer module 120 and the bump structures 121 so as to fix the interposer module 120 to the package substrate 110. The package underfill layer 129 may be formed of an epoxy-based polymeric material.

Although two semiconductor devices 123, 124 are illustrated in FIG. 1B, the package assembly 100 may include any number of semiconductor devices. In addition, each of the first semiconductor device 123 and second semiconductor device 124 may include, for example, a semiconductor die, a system on chip (SOC) die, a system on integrated chips (SoIC) die, and a high-bandwidth memory (HBM) die. In particular, the interposer module 120 may include a high-performance computing (HPC) application and may include, for example, an integrated graphics processing unit (GPU), application specific integrated circuit (ASIC), field-programmable gate array (FPGA), and HBM by chip on wafer on substrate (CoWoS®) technology or integrated fan-out on substrate (INFO-oS) technology.

An interposer underfill layer 126 may be formed around the micro-bumps 128 and between the first semiconductor device 123 and the interposer dielectric layer 122, and between the second semiconductor device 124 and the interposer dielectric layer 122. The interposer underfill layer 126 may be formed as two separate portions under the first semiconductor device 123 and second semiconductor device 124, respectively. Alternatively, the interposer underfill layer 126 may be formed continuously as one layer under the first semiconductor device 123 and second semiconductor device 124. The interposer underfill layer 126 may also be formed between the first semiconductor device 123 and the second semiconductor device 124. The interposer underfill layer 126 may also be formed of an epoxy-based polymeric material.

A molding material layer 127 may be formed over the first semiconductor device 123, the second semiconductor device 124, the interposer underfill layer 126 and the interposer dielectric layer 122. The molding material layer 127 may be formed of an epoxy molding compound (EMC).

A ring 130 may be formed around the interposer module 120 (e.g., in the X-Y plane) and may be fixed to the solder resist layer 115 by an adhesive 160. The adhesive 160 may include, for example, an epoxy adhesive or silicone adhesive. Other adhesive materials are within the contemplated scope of this disclosure. The ring 130 may be formed of a metal such as copper with a nickel coating, an aluminum alloy or stainless steel. Other suitable materials for use as the ring 130 are within the contemplated scope of disclosure. The ring 130 may include, for example, a stiffener ring that may provide rigidity to the package substrate 110.

In an alternative design of the package assembly 100, the ring 130 may be replaced with a package lid (not shown) that may be formed over the interposer module 120 and fixed to the solder resist layer 115 by the adhesive 160. In this alternative design, a thermal interface material (TIM) film may be formed on an upper surface of the interposer module 120. The package lid may contact the TIM film and provide a cover for the interposer module 120. The package lid may be formed, for example, of metal, ceramic or polymer material.

Figure 1C:
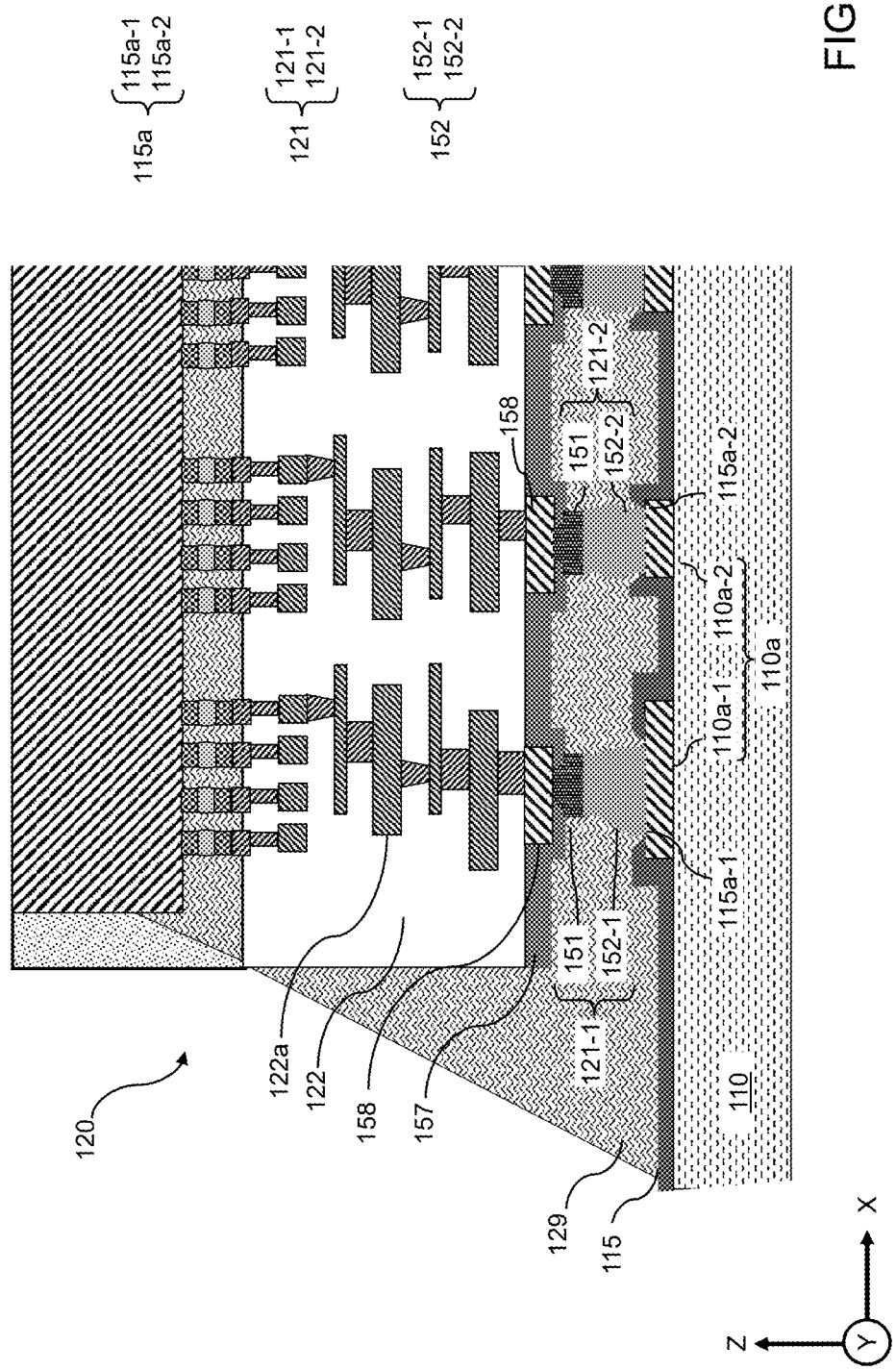
FIG. 1C is a detailed vertical cross-sectional view of the bump structures in the dashed box of FIG. 1B, according to one or more embodiments.

FIG. 1C is a detailed vertical cross-sectional view of the bump structures 121 in the dashed box of FIG. 1B, according to one or more embodiments. As illustrated in FIG. 1C, the bump structures 121 may include a first bump structure 121-1 that may be formed at a corner of the interposer module 120, and a second bump structure 121-2 that may be formed at a location other than a corner of the interposer module 120. The package substrate bonding pads 110*a* may include a first package substrate bonding pad 110*a*-1 that may be formed on the package substrate 110 at a corner of the interposer module 120. The package substrate bonding pads 110*a* may also include a second package substrate bonding pad 110*a*-2 that may be formed on the package substrate 110 at a location other than a corner of the interposer module 120 (e.g., a central portion of the interposer module 120). The SROs 115*a* may include a first SRO 115*a*-1 that may be formed at a corner of the interposer module 120, and a second SRO 115*a*-2 that may be formed at a location other than a corner of the interposer module 120. The first bump structure 121-1 may contact the first package substrate bonding pad 110*a*-1 through the first SRO 115*a*-1. The second bump structure 121-2 may contact the second package substrate bonding pad 110*a*-2 through the second SRO 115*a*-2.

A plurality of interposer bonding pads 158 (e.g., interposer contact pads) may be formed on a mounting surface of the interposer dielectric layer 122 (e.g., a surface of the interposer dielectric layer 122 that faces the package substrate 110). The interposer bonding pads 158 may be composed of copper or another suitable metal (e.g., silver, chromium, nickel, tin, tungsten, titanium, gold, etc.), a copper alloy, or other suitable metal alloy. A passivation layer 157 may be formed on the mounting surface and over the interposer bonding pads 158. The passivation layer 157 may be composed of a polymer dielectric material such as polybenzoxazole (PBO), polyimide, benzocyclobutene (BCB), or other suitable dielectric material. The passivation layer 157 may include an opening over the interposer bonding pads 158 through which a surface of the interposer bonding pads 158 may be exposed. The bump structures 121 may include under bump metallization (UBM) (e.g., C4 UBM) 151 that may contact the surface of the interposer bonding pads 158 through the opening in the passivation layer 157. In particular, the first bump structure 121-1 may be connected by a UBM 151 (first UBM) to an interposer bonding pad 158 (first interposer bonding pad) at the corner of the interposer module 120. The second bump structure 121-2 may be connected by a UBM 151 (second UBM) to an interposer bonding pad 158 (second interposer bonding pad) at the location that is outside the corner of the interposer module 120 (e.g., a central portion of the interposer module 120). The UBM 151 may be electrically connected to the metal interconnect 122*a* and, therefore, the first semiconductor device 123 and third semiconductor device 124, by way of the interposer bonding pad 158.

The UBM 151 may be composed of three parts: a diffusion barrier layer, a seed layer and a post portion. A width (e.g., diameter) of each of the diffusion barrier layer, seed layer and post portion may be substantially the same. That is, a width of the UBM 151 may substantially uniform. Further, as illustrated in FIG. 1C, the width of the UBM 151 may be greater than the opening in the passivation layer 157 so that a portion of the UBM 151 may be formed outside of the opening and on a portion of the passivation layer 157 that surrounds the opening.

The diffusion barrier layer may contact the interposer bonding pad 158 and include, for example, tantalum nitride, titanium nitride, tantalum, titanium, or the like. The seed layer may be formed on the diffusion barrier layer and include, for example, copper, silver, chromium, nickel, tin, gold, and combinations thereof.

The post portion (e.g., copper post) may be formed on the seed layer and have a pillar shape (e.g., a circular cylindrical shape, square cylindrical shape, etc.). The post portion may be composed, for example, of pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In at least one embodiment, the post portion may have a tapered sidewall such that a diameter of the post portion may increase in a direction toward the interposer bonding pad 158. The post portion of the UBM 151 may, for example, have a thickness in the Z-direction in a range from about 10 μm to 80 μm and a diameter (e.g., in the X-Y plane) in a range from about 50 μm to 120 μm.

The bump structures 121 may also include solder joints 152. In particular, the first bump structure 121-1 may include a first solder joint 152-1, and the second bump structure 121-2 may include a second solder joint 152-2. The solder joints 152 may be composed of a solder material including one or more of tin, copper, silver, bismuth, indium, zinc, and antimony. In particular, the solder material may include a tin-silver-copper alloy including about 3-4% silver, 0.5-0.7% copper, and the balance (95%+) tin. A fourth metal such as zinc or manganese may be added to the tin-silver-copper alloy. The solder material may have a melting point in a range from 90° C. to 450° C., and more particularly, in a range from about 220° C. to 260° C. The solder joint 152 may be formed, for example, by a reflow process (e.g., reflow soldering process) in which a solder layer on the UBM 151 and a pre-solder layer on the package substrate bonding pad 110*a* are melted together at a temperature in the melting point range for the solder material (e.g., about 220° C. to 260° C.) to form the solder joint 152.

In order to reduce a risk of solder fatigue (e.g., C4 solder fatigue which may be more prevalent at a corner of the interposer module 120, there may be several structural differences between the first package substrate bonding pad 110a-1 and the second package substrate bonding pad 110a-2, between the first SRO 115a-1 and the second SRO 115a-2, and between the first solder joint 152-1 and the second solder joint 152-2. In particular, as illustrated in FIG. 1C, a size of the first package substrate bonding pad 110a-1 may be greater than a size of the second package substrate bonding pad 110a-2. The term "size" as it is used in the present disclosure to describe the features illustrated in FIG. 1C may be construed to mean, for example, diameter, length in the X-direction or length in the Y-direction. In at least one embodiment, a size of the first package substrate bonding pad 110a-1 located in a corner position may be at least 50% greater than a size of the second package substrate bonding pad 110a-2 located in a position other than a corner. A size of the first SRO 115a-1 may also be greater than a size of the second SRO 115a-2. In at least one embodiment, the size (e.g., length) of the first SRO 115a-1 may be at least 50% greater than the size (e.g., diameter) of the second SRO 115a-2. A volume of the first solder joint 152-1 may also be greater than a volume of the second solder joint 152-2. In at least one embodiment, the volume of the first solder joint 152-1 may be at least twice the volume of the second solder joint 152-2.

Figure 1D:
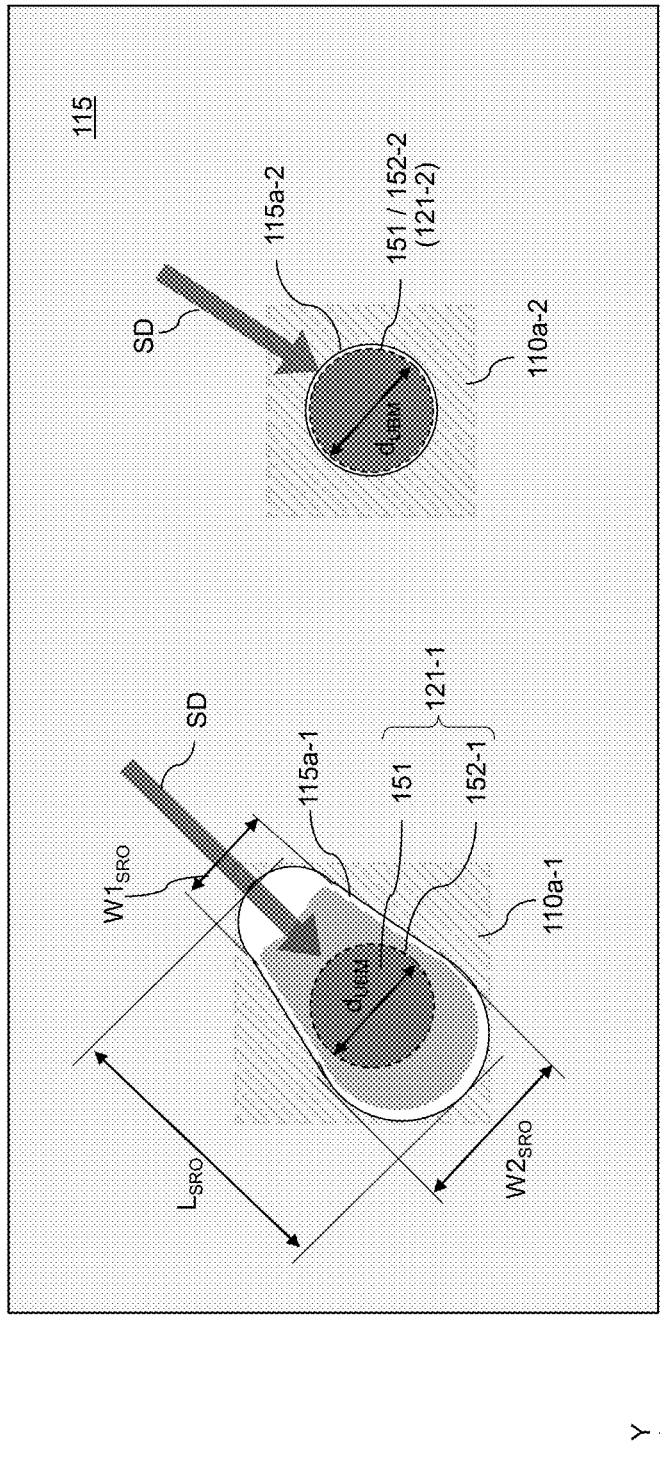
FIG. 1D is a plan view of the first bump structure and the second bump structure according to one or more embodiments.

FIG. 1D is a plan view of the first bump structure 121-1 and the second bump structure 121-2 according to one or more embodiments. As illustrated in FIG. 1D, the first package substrate bonding pad 110a-1 may have a substantially square shape. The first package substrate bonding pad 110a-1 may alternatively have a different shape such as a rectangular shape, circular shape, oval shape, etc. The first package substrate bonding pad 110a-1 is shaded in FIG. 1D to indicate that (except for the surface of the first package substrate bonding pad 110a-1 that is exposed through the first SRO 115a-1) the first package substrate bonding pad 110a-1 may be covered by the solder resist layer 115.

The first SRO 115a-1 may have an elongated (e.g., oblong-droplet) shape. A longitudinal direction of the first SRO 115a-1 may be in a direction parallel to a direction from a center of the interposer module 120 to a center of the UBM 151 in a projection plane of a bottom of the interposer dielectric layer 122. Directional arrows SD are included in FIG. 1D to indicate a shift direction of the first SRO 115a-1 and second SRO 115a-2 with respect to the UBMs 151. The shift direction may also be parallel to a direction from a center of the interposer module 120 to a center of the UBM 151. It should be noted that the directional arrow SD for the first SRO 115a-1 may have a different angle than the directional arrow SD for the second SRO 115a-2, indicating that a direction from the center of the interposer module 120 to the first SRO 115a-1 may be different than a direction from the center of the interposer module 120 to the second SRO 115a-2.

The UBM 151 of the first bump structure 121-1 may have a diameter $d_{UBM}$. The UBM 151 may be contained within the first solder joint 152-1 in the plan view. The first solder joint 152-1 may substantially fill the first SRO 115a-1 in the plan view. The first solder joint 152-1 may also be contained within the first SRO 115a-1 in the plan view. Thus, for example, the first solder joint 152-1 may contact a sidewall of the first SRO 115a-1, but may not extend over the sidewall of the first SRO 115a-1 in the plan view.

The first SRO 115a-1 (e.g., elongated SRO) may have a length $L_{SRO}$ in the longitudinal direction that is greater than the diameter $d_{UBM}$ of a UBM 151. The first SRO 115a-1 may also include a first end that is closest to the central portion of the interposer module 120 and has a first width $W1_{SRO}$. The first SRO 115a-1 may also include a second end that is opposite the first end and has a second width $W2_{SRO}$. The first width $W1_{SRO}$, second width $W2_{SRO}$ and diameter $d_{UBM}$ may have the following relationship: $W2_{SRO} > W1_{SRO} \geq d_{UBM}$.

As illustrated in FIG. 1D, a size of the second bump structure 121-2 in the X-direction and Y-direction may be less than a size of the first bump structure 121-1. In addition, a size of the first package substrate bonding pad 110a-1 may be greater than a size of the second package substrate bonding pad 110a-2. In at least one embodiment, a width of the first package substrate bonding pad 110a-1 in (e.g., in the X-direction or Y-direction) may be more than 1 μm greater than the length $L_{SRO}$ of the first SRO 115a-1.

Similar to the first package substrate bonding pad 110a-1, the second package substrate bonding pad 110a-2 may have a substantially square shape. The second package substrate bonding pad 110a-2 may alternatively have a different shape such as a rectangular shape, circular shape, oval shape, etc. Similar to the first package substrate bonding pad 110a-1, the second package substrate bonding pad 110a-2 is shaded in FIG. 1D to indicate that (except for the surface of the second package substrate bonding pad 110a-2 that is exposed through the second SRO 115a-2) the first package substrate bonding pad 110a-1 may be covered by the solder resist layer 115.

In contrast to the first SRO 115a-1, the second SRO 115a-2 may have a circular shape. The UBM 151 of the second bump structure 121-2 may have a diameter that is substantially the same as the diameter $d_{UBM}$ of the UBM 151 of the first bump structure 121-1. The UBM 151 may be contained within the second solder joint 152-2 in the plan view. The second solder joint 152-2 may substantially fill the second SRO 115a-2 in the plan view. The second solder joint 152-2 may also be contained within the second SRO 115a-2 in the plan view. That is, a diameter of the second solder joint 152-2 and a diameter of the second SRO 115a-2 may be substantially the same as the diameter $d_{UBM}$ of the UBM 151. Thus, for example, the second solder joint 152-2 may contact a sidewall of the second SRO 115a-2, but may not extend over the sidewall of the second SRO 115a-2 in the plan view.

Figure 1E:
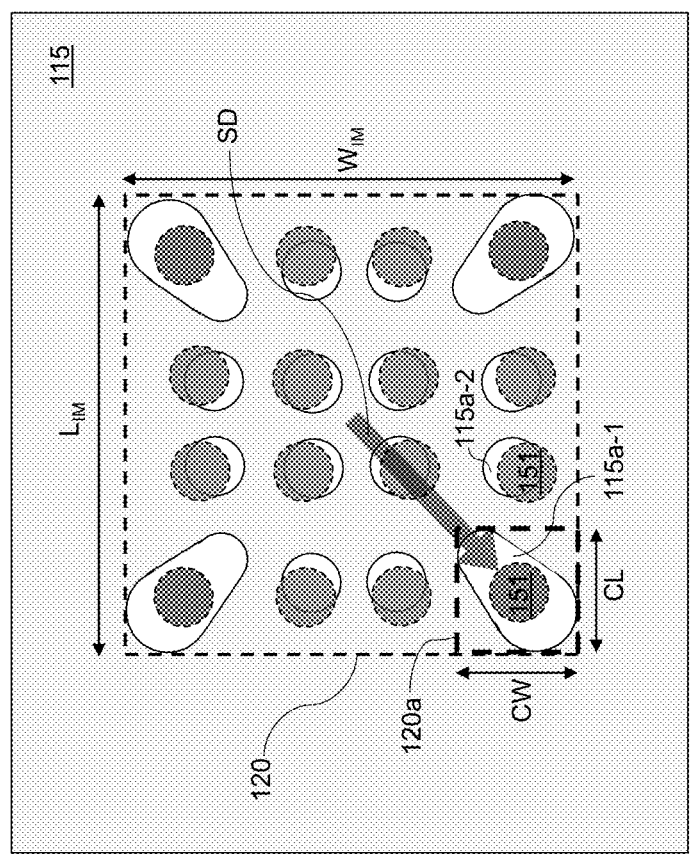
FIG. 1E is a plan view of a pre-joint arrangement of the solder resist openings (SROs) with respect to the interposer module, according to one or more embodiments.

FIG. 1E is a plan view of a "pre-joint" arrangement of the SROs 115a with respect to the interposer module 120, according to one or more embodiments. That is, FIG. 1E illustrates an arrangement between the SROs 115a and the interposer module 120 before the solder joint 152 is formed such as by a reflow process. As illustrated in FIG. 1E, the interposer module 120 may have a substantially square shape in the plan view. The interposer module 120 may include an interposer module length $L_{IM}$ and an interposer module width $W_{IM}$. The SROs 115a may be formed in the solder resist layer 115 of the package substrate 110 to include a first SRO 115a-1 located at each of the four corners of the interposer module 120, and second SROs 115a-2 at locations of the interposer module 120 that are outside the corner areas 120a.

Each of the four corners of the interposer module 120 may have a corner area 120a including a corner area length CL along the interposer module length $L_{IM}$ and corner area width CW along the interposer module width $W_{IM}$. The first SRO 115a-1 may be contained within the corner area 120a. The corner area length CL and the interposer module length $L_{IM}$ may have the following relationship: 50 μm ≤ CL ≤ ½

$L_{IM}$. The corner area width CW and the interposer module width Win may have the following relationship: 50 µm≤CW≤½ $W_{IM}$.

The SROs 115a in the embodiment illustrated in FIG. 1E may be arranged in the solder resist layer 115 so as to account for the difference in the CTE of the package substrate 110 and the CTE of the interposer module 120. That is, the embodiment illustrated in FIG. 1E may constitute an initial position of the SROs 115a with respect to the UBMs 151, prior to forming the solder joint 152. A directional arrow SD is included in FIG. 1E to indicate a shift direction of the SROs 115a with respect to the UBMs 151. The shift direction of the SROs 115a may be parallel to a direction from a center of the interposer module 120 to a center of the UBM 151 in a projection plane of a bottom of the interposer dielectric layer 122.

Figure 1F:
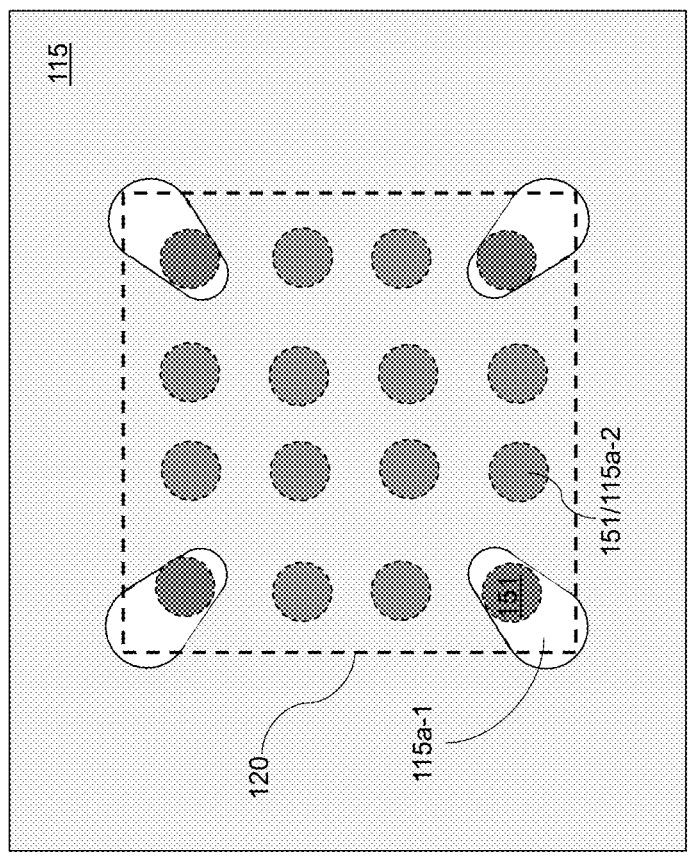
FIG. 1F is a plan view of an "after joint" arrangement of the SROs with respect to the interposer module, according to one or more embodiments.

FIG. 1F is a plan view of an "after joint" arrangement of the SROs 115a with respect to the interposer module 120, according to one or more embodiments. That is, FIG. 1F illustrates an arrangement between the SROs 115a and the interposer module 120 after the solder joint 152 is formed such as by a reflow process to bond the interposer module 120 to the package substrate 110. As illustrated in FIG. 1F, the expansion of the package substrate 110 in the reflow process may cause the SROs 115a to shift away from a central portion of the interposer module 120. The expansion of the interposer module 120 in the reflow process may cause the UBMs 151 to shift away from a central portion of the interposer module 120 but to a lesser extent that the shift in the SROs 115a. As result, a location of the UBM 151 with respect to the first SROs 115a-1 may move away from the second end of the first SROs 115a-1 (e.g., a wider end having a width $W2_{SRO}$) toward the first end of the first SROs 115a-1 (e.g., a narrower end having a width $W1_{SRO}$). Further, a location of the UBM 151 with respect to the second SROs 115a-2 may move from a position that is out of alignment with the second SROs 115a-2 to a position that is substantially aligned (e.g., substantially concentric) with the second SROs 115a-2. Thus, the UBMs 151 on the interposer module 120 may be substantially aligned with both the first SROs 115a-1 and the second SROs 115a-2 in the solder resist layer 115 on the package substrate 110.

Figure 2A:
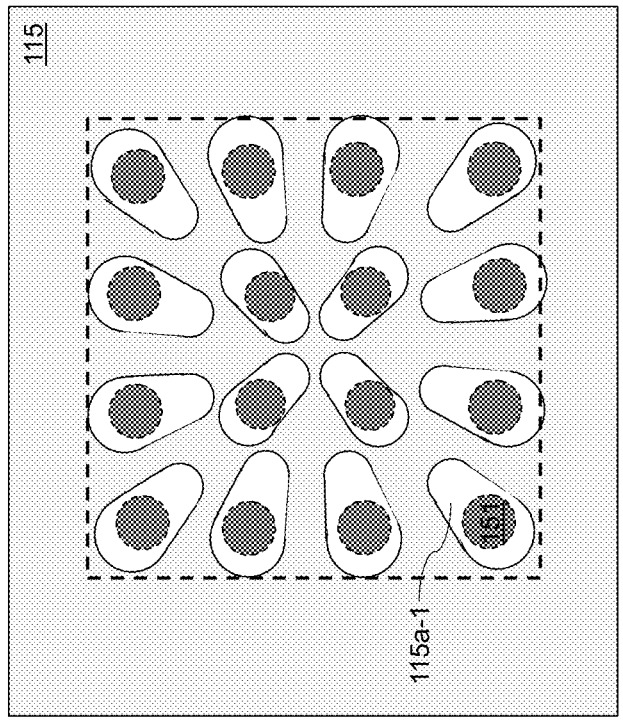
FIG. 2A is a plan view of a first alternative pre-joint arrangement of the SROs with respect to the interposer module, according to one or more embodiments.

FIG. 2A is a plan view of a first alternative embodiment having a pre-joint arrangement of the SROs 115a with respect to the interposer module 120, according to one or more embodiments. In the first alternative embodiment having a pre-joint arrangement, the SROs 115a may include first SROs 115a-1 (e.g., elongated SROs) located around the entire outer edge of the interposer module 120. The SROs 115a may also include second SROs 115a-2 (e.g., circular SROs) located in a central portion of the interposer module 120.

Figure 2B:
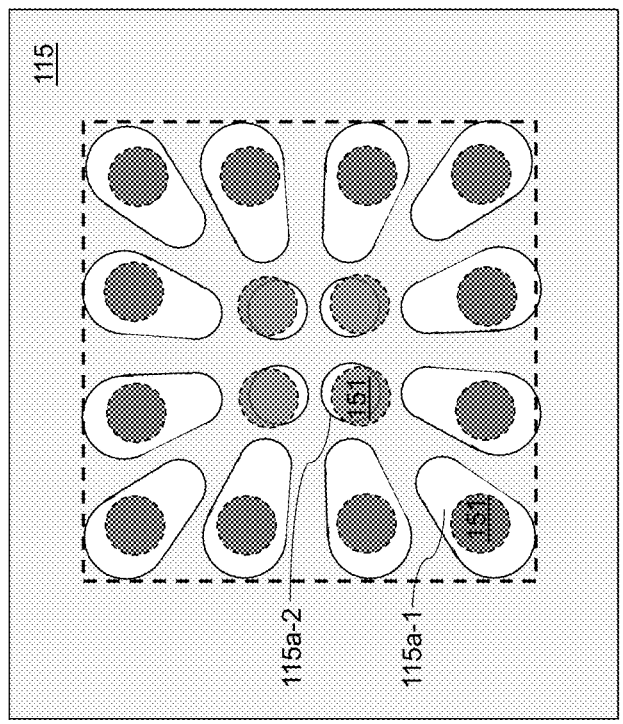
FIG. 2B is a plan view of a second alternative pre-joint arrangement of the SROs with respect to the interposer module, according to one or more embodiments.

FIG. 2B is a plan view of a second alternative embodiment having a pre-joint arrangement of the SROs 115a with respect to the interposer module 120, according to one or more embodiments. In the second alternative embodiment having a pre-joint arrangement, the SROs 115a may include first SROs 115a-1 (e.g., elongated SROs) located around the entire outer edge of the interposer module 120, and also in a central portion of the interposer module 120. That is, the SROs 115a in the second alternative embodiment having a pre-joint arrangement that may consist entirely of the first SROs 115a-1. Other suitable alternative embodiments having pre-joint arrangements of the SROs 115a with respect to the interposer module 120 are within the contemplated scope of disclosure.

FIGS. 3A-3D provide plan views of alternative designs of the first SROs 115a-1, according to one or more embodiments. FIG. 3A illustrates a first alternative design in which the first SRO 115a-1 has an elongated polygon (e.g., pentagon) shape, according to one or more embodiments. FIG. 3B illustrates a second alternative design in which the first SRO 115a-1 has an elongated trapezium shape, according to one or more embodiments. FIG. 3C illustrates a third alternative design in which the first SRO 115a-1 has an arrow shape, according to one or more embodiments. FIG. 3D illustrates a fourth alternative design in which the first SRO 115a-1 has a truncated ellipse shape, according to one or more embodiments. Other suitable alternative designs for the first SROs 115a-1 are within the contemplated scope of disclosure.

FIG. 4 is a plan view of an alternative design of the UBM 151 for a first SRO 115a-1, according to one or more embodiments. In this alternative design, the UBM 151 may have an ellipse shape or oval shape. A major axis of the ellipse shape or oval shape may be substantially aligned with the major axis of the first SRO 115a-1. A width $W_{minor}$ of the ellipse shape or oval shape along its minor axis may be less than or equal to the first width $W1_{SRO}$ of the SRO 115a-1.

Directional arrows SD are included in FIGS. 3A-3D and FIG. 4 to indicate a shift direction of the first SROs 115a-1 with respect to the UBMs 151. The shift direction of the first SROs 115a-1 may be parallel to a direction from a center of the interposer module 120 to a center of the UBM 151 in a projection plane of a bottom of the interposer dielectric layer 122.

FIGS. 5A-5I illustrate a method of forming the package assembly 100 according to one or more embodiments.

FIG. 5A is a vertical cross-sectional view of an exemplary intermediate structure after forming the package substrate bonding pads 110a on the package substrate 110, according to one or more embodiments. The package substrate bonding pads 110a may be formed, for example, by first depositing a metal layer on a surface of the package substrate 110. The metal layer may include copper or another suitable metal (e.g., silver, chromium, nickel, tin, tungsten, titanium, gold, etc.), a copper alloy, or other suitable metal alloy. The metal layer may be deposited, for example, by a suitable deposition process such as physical vapor deposition, chemical vapor deposition, sputtering, etc. The metal layer may then be etched to form the conductive pads 110a. The metal layer may be etched, for example, by using a photolithographic process. The photolithographic process may include forming a patterned photoresist mask (not shown) on the metal layer, and etching (e.g., wet etching, dry etching, etc.) the exposed upper surface of the metal layer through openings in the photoresist mask. The photoresist mask may be subsequently removed by ashing, dissolving the photoresist mask or by consuming the photoresist mask during the etch process.

FIG. 5B is a vertical cross-sectional view of the exemplary intermediate structure after forming the solder resist layer 115 on the package substrate 110, according to one or more embodiments. The solder resist layer 115 (e.g., polymer material) may be applied as a liquid photo-imageable film. The liquid photo-imageable film can be applied, for example, by silk-screening or spraying the liquid photo-imageable film onto the surface of the package substrate 110 and over the package substrate bonding pads 110a. The solder resist layer 115 may alternatively be applied as a dry-film photo-imageable film that may be vacuum-laminated onto the surface of the package substrate 110 and over the package substrate bonding pads 110a.

Figure 5C:
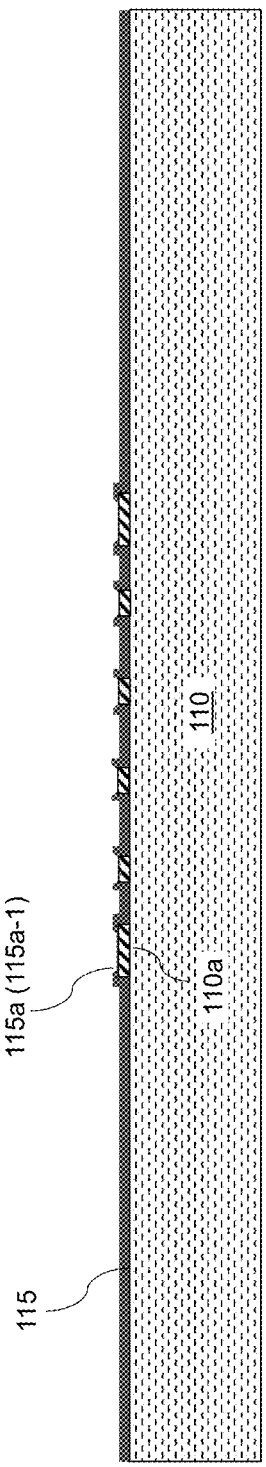
FIG. 5C is a vertical cross-sectional view of the exemplary intermediate structure after forming the SROs in the solder resist layer, according to one or more embodiments.

FIG. 5C is a vertical cross-sectional view of the exemplary intermediate structure after forming the SROs 115a in the solder resist layer 115, according to one or more embodiments. The SROs 115a may be formed, for example, by using a photolithographic process. The photolithographic process may include forming a patterned photoresist mask (not shown) on the solder resist layer 115, and etching (e.g., wet etching, dry etching, etc.) the exposed upper surface of the solder resist layer 115 through openings in the photoresist mask. The photoresist mask may be subsequently removed by ashing, dissolving the photoresist mask or by consuming the photoresist mask during the etch process. After the SROs 115a are formed, the solder resist layer may be cured such as by a thermal cure or ultraviolet (UV) cure.

Figure 5D:
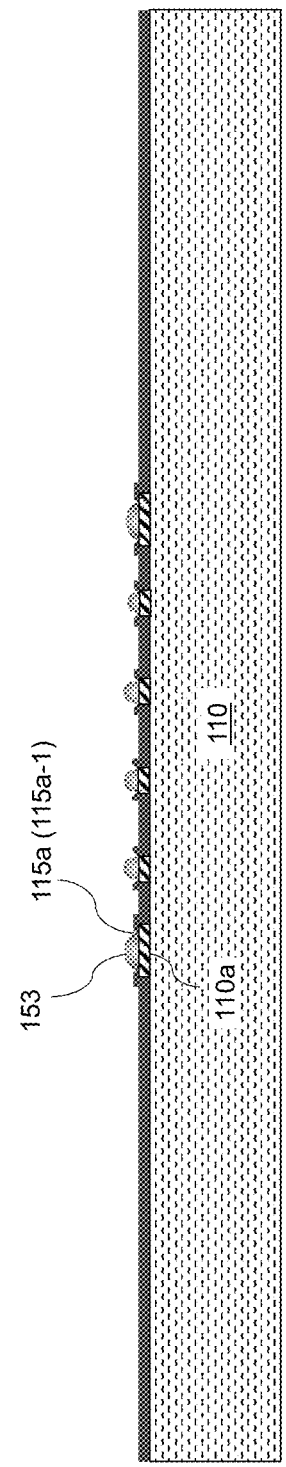
FIG. 5D is a vertical cross-sectional view of the exemplary intermediate structure after forming a pre-solder layer in the SROs, according to one or more embodiments.

FIG. 5D is a vertical cross-sectional view of the exemplary intermediate structure after forming a pre-solder layer 153 in the SROs 115a, according to one or more embodiments. The pre-solder layer 153 may substantially fill the SROs 115a. In particular, the pre-solder layer 153 may substantially fill the first SROs 115a-1. Thus, the pre-solder layer 153 in the first SROs 115a-1 may have an elongated shape that is substantially the same as the elongated shape of the first SROs 115a-1. The pre-solder layer 153 in the second SROs 115a-2 may have an circular shape that is substantially the same as the circular shape of the second SROs 115a-2. The pre-solder layer 153 may be composed, for example, of a solder material including one or more of tin, copper, silver, bismuth, indium, zinc, and antimony. In particular, the solder material may include a tin-silver-copper alloy including about 3-4% silver, 0.5-0.7% copper, and the balance (95%+) tin. The pre-solder layer 153 may be formed on the package substrate bonding pad 110a, for example, by a plating process or reflowing process.

Figure 5E:
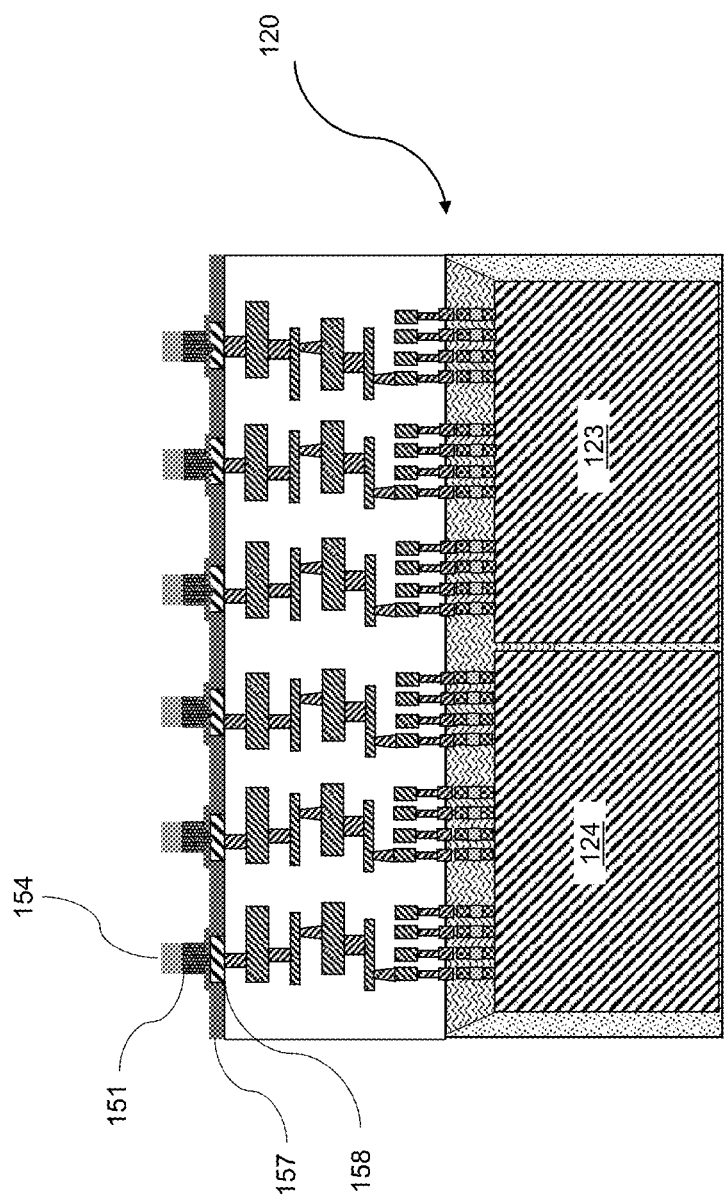
FIG. 5E is a vertical cross-sectional view of the exemplary intermediate structure after forming the UBM on the interposer bonding pad, and forming a solder layer on the UBM, according to one or more embodiments.

FIG. 5E is a vertical cross-sectional view of the exemplary intermediate structure after forming the UBM 151 on the interposer bonding pad 158, and forming a solder layer 154 on the UBM 151, according to one or more embodiments. The UBM 151 may be formed by first depositing (e.g., by physical vapor deposition (PVD) or sputtering) a first material (e.g., Ti) for the diffusion barrier layer on the passivation layer 157. The first material may contact a surface of the interposer bonding pads 158 through openings in the passivation layer 157. Then, a second material (e.g., copper or copper alloy) for the seed layer may then be deposited (e.g., by physical vapor deposition (PVD) or sputtering) on the first material for the diffusion barrier layer.

The first material (e.g., Ti) and second material (e.g., copper or copper alloy) may then be etched simultaneously to form the diffusion barrier layer and seed layer in and around the openings in the passivation layer 157. The etching may be performed, for example, by using a photolithographic process. The photolithographic process may include forming a patterned photoresist mask (not shown) on the seed layer, and etching (e.g., wet etching, dry etching, etc.) the exposed portions of the seed layer and diffusion barrier layer through openings in the photoresist mask. The photoresist mask may be subsequently removed by ashing, dissolving the photoresist mask or by consuming the photoresist mask during the etch process.

The post portion may then be formed on the seed layer. The post portion may be formed, for example, by sputtering, printing, electro plating, electroless plating, and commonly used chemical vapor deposition (CVD) methods. In at least one embodiment, an electro-chemical plating (ECP) may be carried out to form a copper post portion having a thickness in the Z-direction in a range from 40 μm to 70 μm.

The solder layer 154 may then be formed on the UBM 151 (e.g., on the post portion of the UBM 151. The solder layer 154 may be composed, for example, of a solder material including one or more of tin, copper, silver, bismuth, indium, zinc, and antimony. In particular, the solder material may include a tin-silver-copper alloy including about 3-4% silver, 0.5-0.7% copper, and the balance (95%+) tin. The solder layer 154 may be formed by a plating process or a reflowing process.

Figure 5F:
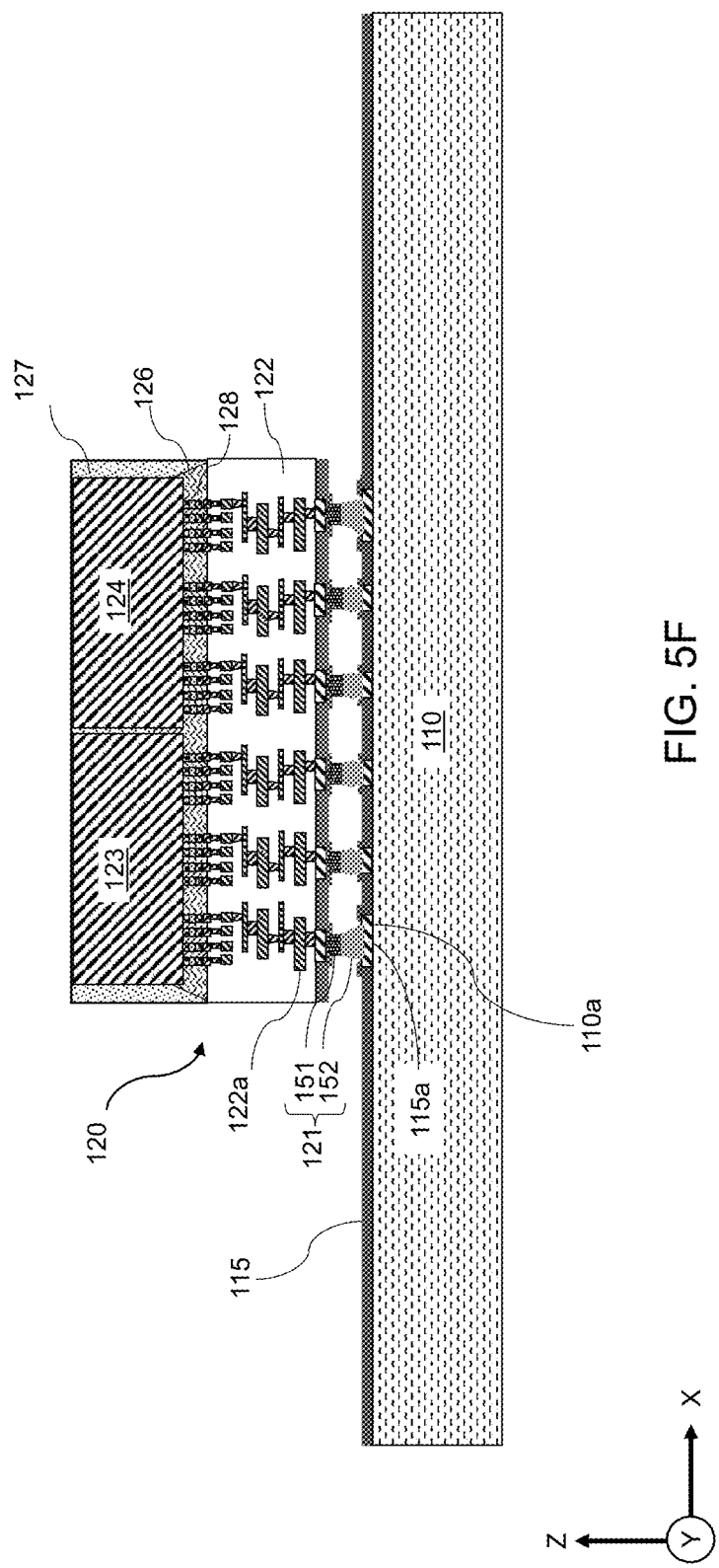
FIG. 5F is a vertical cross-sectional view of the exemplary intermediate structure after the interposer module is mounted on the package substrate, according to one or more embodiments.

FIG. 5F is a vertical cross-sectional view of the exemplary intermediate structure after the interposer module 120 is mounted on the package substrate 110, according to one or more embodiments.

The interposer module 120 as shown in FIG. 5E may be inverted and positioned over the package substrate 110. The UBMs 151 on the interposer module 120 may be aligned with SROs 115a on the package substrate 110. The interposer module 120 may be lowered down onto the package substrate 110 so that that solder layer 154 on the UBMs 151 may contact the pre-solder layer 153 in the SROs 115a. A reflow process may be performed in which the intermediate structure is heated to a reflow temperature of the pre-solder layer 153 and solder layer 154 (e.g., about 220° C. to 260° C.). This may cause the pre-solder layer 153 and solder layer 154 to melt and combine to form the solder joints 152 of the bump structures 121. The intermediate structure may then be allowed to cool so that that the bump structures 121 may constitute a solid interconnection between the interposer module 120 and the package substrate 110.

Figure 5G:
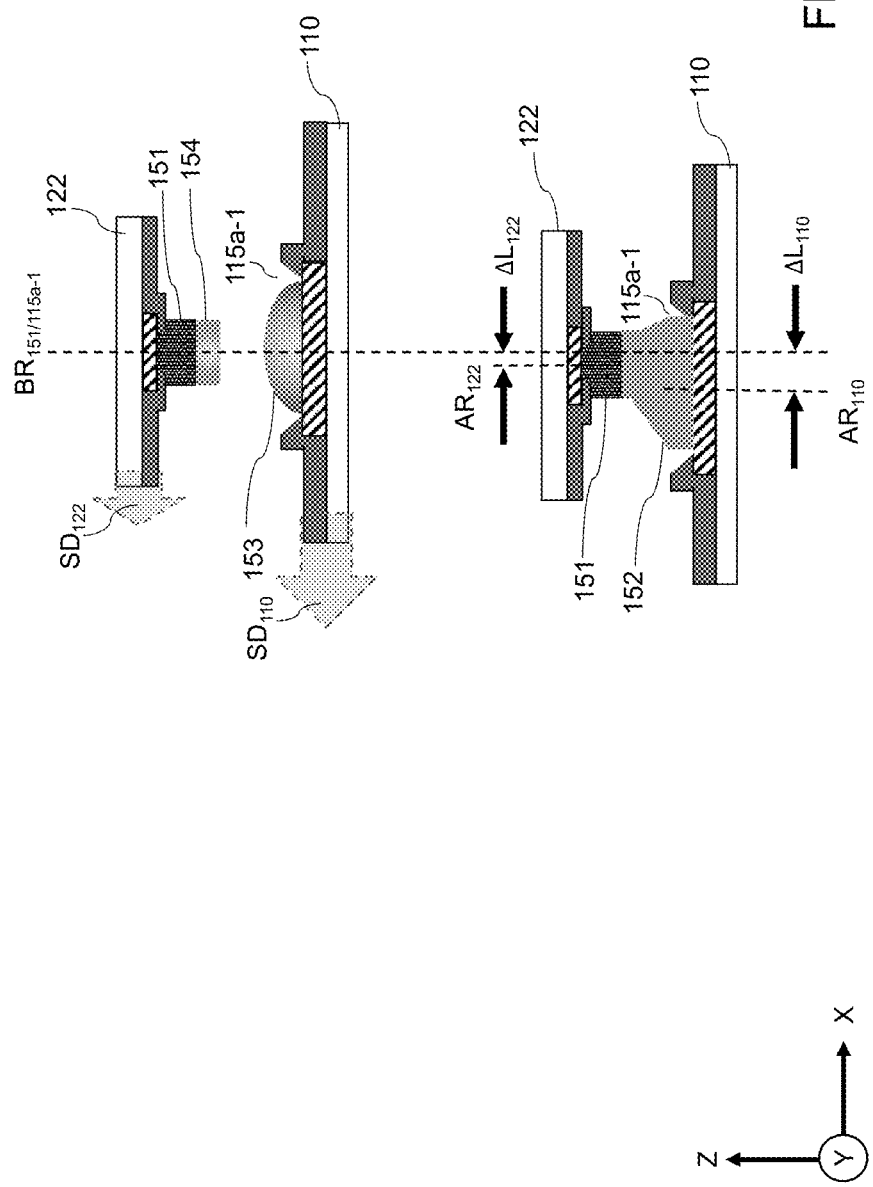
FIG. 5G is a vertical cross-sectional view of a portion of the exemplary intermediate structure before and after the reflow process, according to one or more embodiments.

FIG. 5G is a vertical cross-sectional view of a portion of the exemplary intermediate structure before and after the reflow process, according to one or more embodiments. The upper portion of FIG. 5G illustrates an alignment of the UBM 151 with a first SRO 115a-1 (e.g., an elongated SRO) that may be formed at a corner of the interposer dielectric layer 122. The dashed line $BR_{151/115a-1}$ through a center of the UBM 151 and a center of the first SRO 115a-1 (in the X-direction and Y-direction) indicates a substantial alignment of the center of the UBM 151 and the center of the first SRO 115a-1 before the reflow process.

The directional arrow $SD_{122}$ in FIG. 5G indicates a shift direction (in the X-direction and Y-direction) of the interposer dielectric layer 122 due to thermal expansion during the reflow process. In at least one embodiment an expansion of the interposer module 120 during the reflow process may be constituted by an expansion of the interposer dielectric layer 122. The directional arrow $SD_{110}$ indicates a shift direction (in the X-direction and Y-direction) of the package substrate 110 due to thermal expansion during the reflow process. The shift direction of the first SRO 115a-1 (due to the thermal expansion of the package substrate 110) may be parallel to a direction from a center of the interposer module 120 to a center of the UBM 151 in a projection plane of a bottom of the interposer dielectric layer 122. The shift direction of the UBM 151 (due to the thermal expansion of the interposer dielectric layer 122) may be in substantially the same direction as the shift direction of the first SRO 115a-1. However, an amount of shift of the UBM 151 may be significantly less than an amount of shift of the first SRO 115a-1.

The lower portion of FIG. 5G illustrates the change in alignment of the UBM 151 with the first SRO 115a-1 after the reflow process. As illustrated in the lower portion of FIG. 5G, the high temperature of the reflow process has caused the pre-solder layer 153 and solder layer 154 to melt together and combine to form the solder joint 152. As illustrated in the lower portion of FIG. 5G, the high temperature of the reflow process may cause a difference in the degree of expansion between the interposer module 120 (e.g., interposer dielectric layer 122) and the package substrate 110. Thus, a center of the UBM 151 may be shifted in the X-direction and Y-direction relative to the first SRO 115a-1.

In the lower portion of FIG. 5G, the dashed line $AR_{122}$ through a center of the UBM 151 indicates a center of the UBM 151 after the reflow process. The amount of the shift (in the X-direction and Y-direction) of the center of the UBM 151 caused by the reflow process may be indicated by the distance $\Delta L_{122}$ between the dashed line $AR_{122}$ and the dashed line $BR_{151/115a-1}$. The dashed line $AR_{110}$ through a center of the first SRO 115a-1 indicates a center of the first SRO 115a-1 after the reflow process. The amount of the shift (in the X-direction and Y-direction) of the center of the first SRO 115a-1 caused by the reflow process may be indicated by the distance $\Delta L_{110}$ between the dashed line $AR_{110}$ and the dashed line $BR_{151/115a-1}$. As shown in the lower portion of FIG. 5G, the distance $\Delta L_{110}$ is significantly greater than the distance $\Delta L_{122}$, indicating that an amount of shift of the UBM 151 during the reflow process may be significantly less than an amount of shift of the first SRO 115a-1 during the reflow process. The amount of shift of the UBM 151 may be less than the amount of shift of the first SRO 115a-1 because the degree of expansion of the interposer module 120 (e.g., interposer dielectric layer 122) in a direction from the center of the interposer module 120 may be less than the degree of expansion of the package substrate 110 in a direction from the center of the interposer module 120.

It should be noted that each UBM 151 on the interposer module 120 may shift in a direction from the center of the interposer module 120 to the center of UBM 151 (in both the X-direction and in the Y-direction) to some extent during the reflow process. Further, each SRO 115a on the package substrate 110 may shift in a direction from the center of the interposer module 120 to the center of UBM 151 (in both the X-direction and in the Y-direction) to some extent during the reflow process.

However, because the first SRO 115a-1 has an elongated shape, the UBM 151 may still be aligned with the first SRO 115a-1. That is, there may be no dislocation (e.g., misalignment, offset, etc.) between the UBM 151 and the first SRO 115a-1. Therefore, a deformation of the solder joint 152 (e.g., a defective shape such as a necking-twist bump shape of the solder joint 152) may be avoided.

Figure 5H:
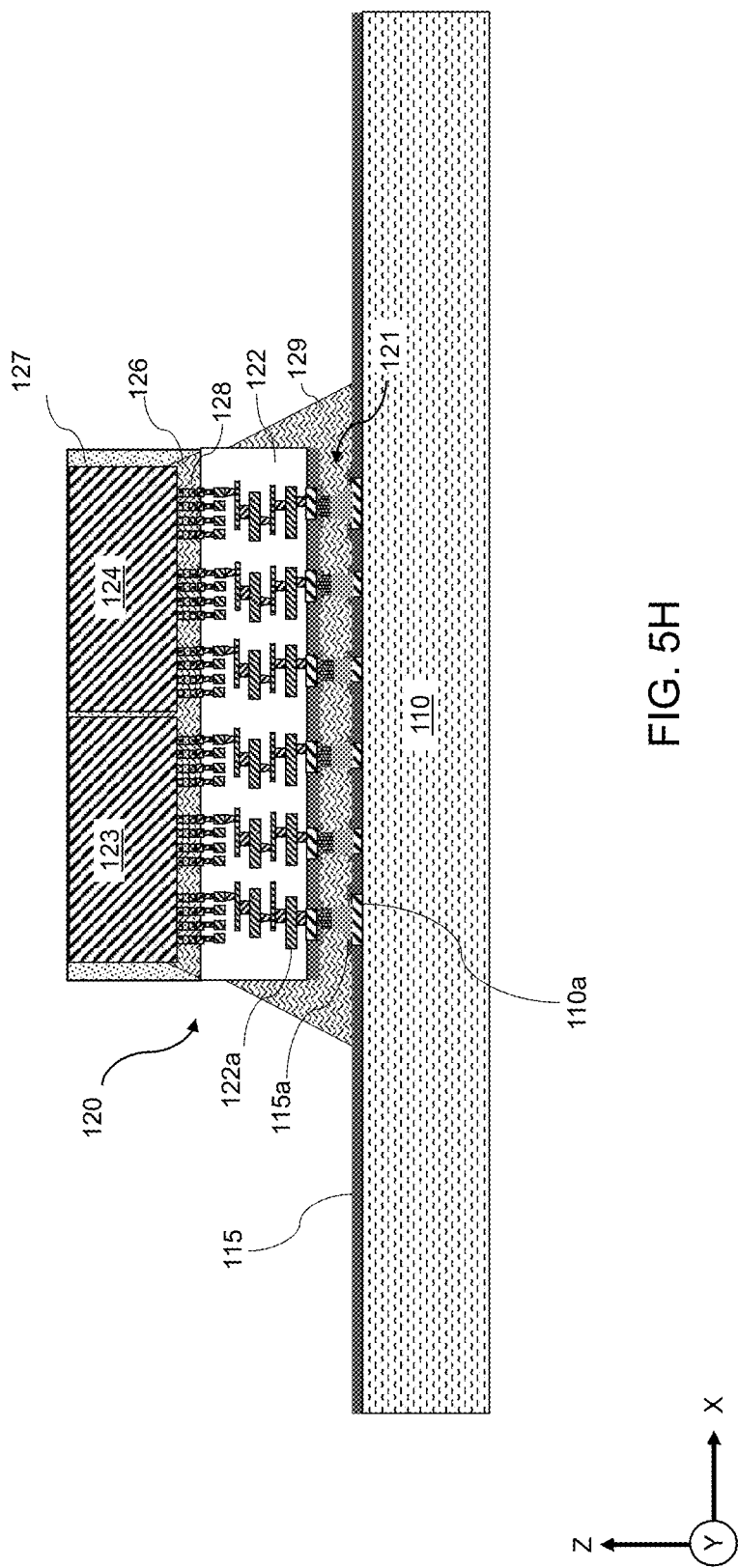
FIG. 5H is a vertical cross-sectional view of the exemplary intermediate structure after forming the package underfill layer on the package substrate, according to one or more embodiments.

FIG. 5H is a vertical cross-sectional view of the exemplary intermediate structure after forming the package underfill layer 129 on the package substrate 110, according to one or more embodiments. The package underfill layer 129 may be formed of an epoxy-based polymeric material. As illustrated in FIG. 5H, the package underfill layer 129 may be formed under and around the interposer module 120 and the bump structures 121 so as to fix the interposer module 120 to the package substrate 110. The package underfill layer 129 may then be cured, for example, in a box oven for about 90 minutes at about 150° C. to provide the package underfill layer 129 with a sufficient stiffness and mechanical strength.

Figure 5I:
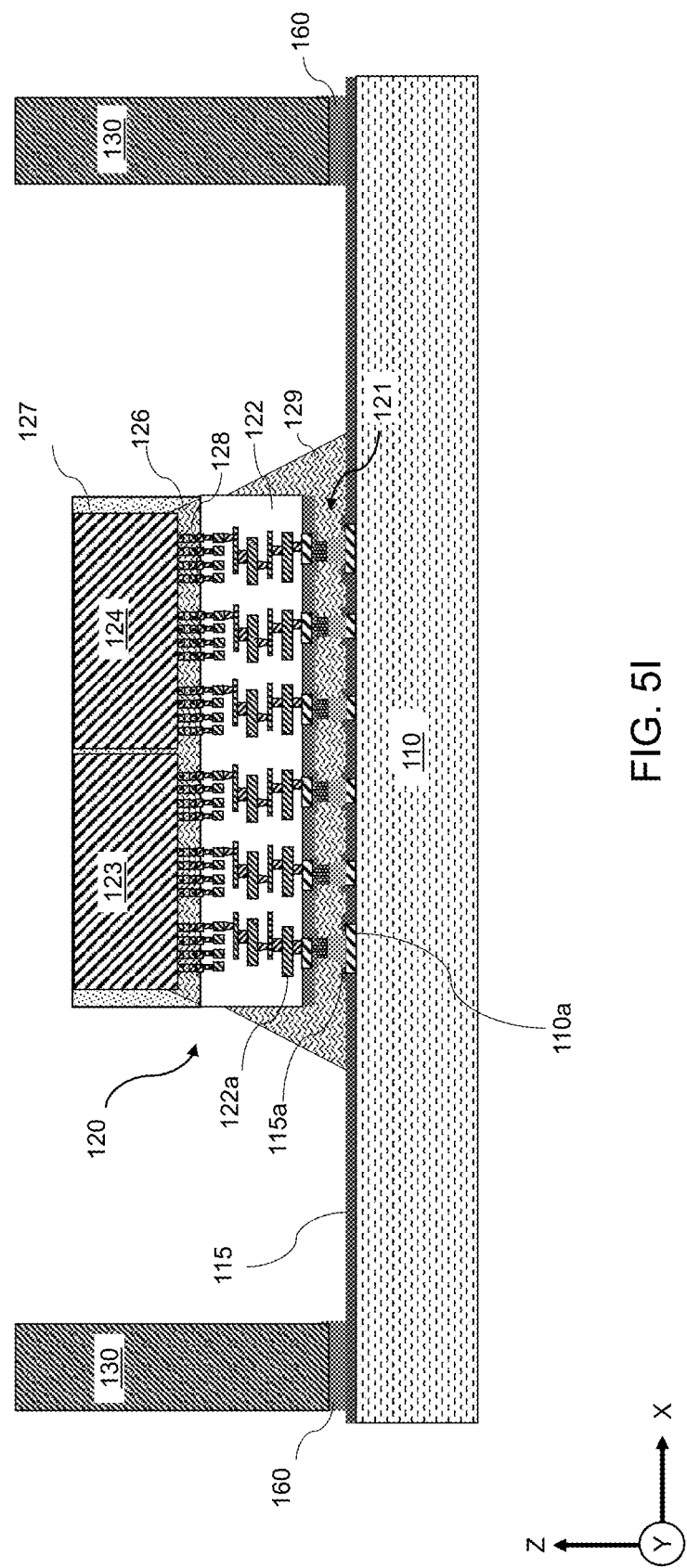
FIG. 5I is a vertical cross-sectional view of the exemplary intermediate structure after forming the ring on the package substrate, according to one or more embodiments.

FIG. 5I is a vertical cross-sectional view of the exemplary intermediate structure after forming the ring 130 on the package substrate 110, according to one or more embodiments. The adhesive 160 may be applied to the solder resist layer 115 at a position corresponding to a placement of the ring 130, and in a quantity sufficient to securely bond the ring 130 to the package substrate 110. In particular, a bead of the adhesive 160 may be formed continuously around the interposer module 120 in a shape and location corresponding to a shape and location of the ring 130. The ring 130 (e.g., metal ring) may then be pushed down onto the bead of adhesive 160 around the interposer module 120.

The adhesive 160 may then be cured so as to securely fix the ring 130 to the package substrate 110. The ring 130 may be clamped to the package substrate 110 for a period to allow the adhesive 160 to cure and form a secure bond between the package substrate 110 and the ring 130. The clamping of the ring 130 to the package substrate 110 may be performed, for example, by using a heat clamp module. The heat clamp module may apply a uniform force across the ring 130.

Figure 5J:
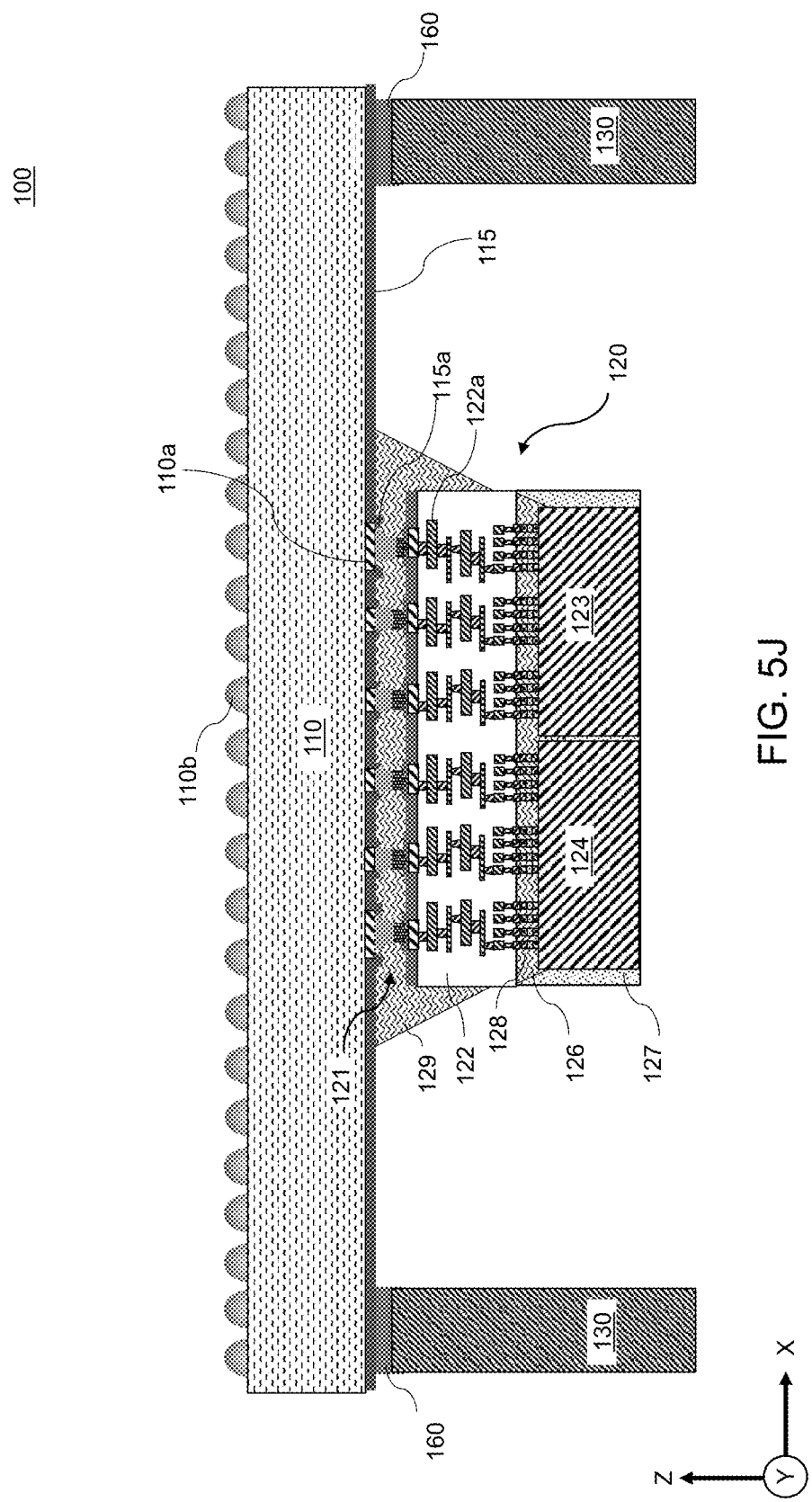
FIG. 5J is a vertical cross-sectional view of an intermediate structure in which a plurality of solder balls may be formed on the package substrate according to one or more embodiments.

FIG. 5J is a vertical cross-sectional view of an intermediate structure in which a plurality of solder balls 110b may be formed on the package substrate 110 according to one or more embodiments. The plurality of solder balls 110b may constitute a ball-grid array (BGA) that may allow the package assembly 100 to be securely mounted (e.g., by surface mount technology (SMT)) on a substrate such as a printed circuit board and electrically coupled to the substrate.

Figure 6:
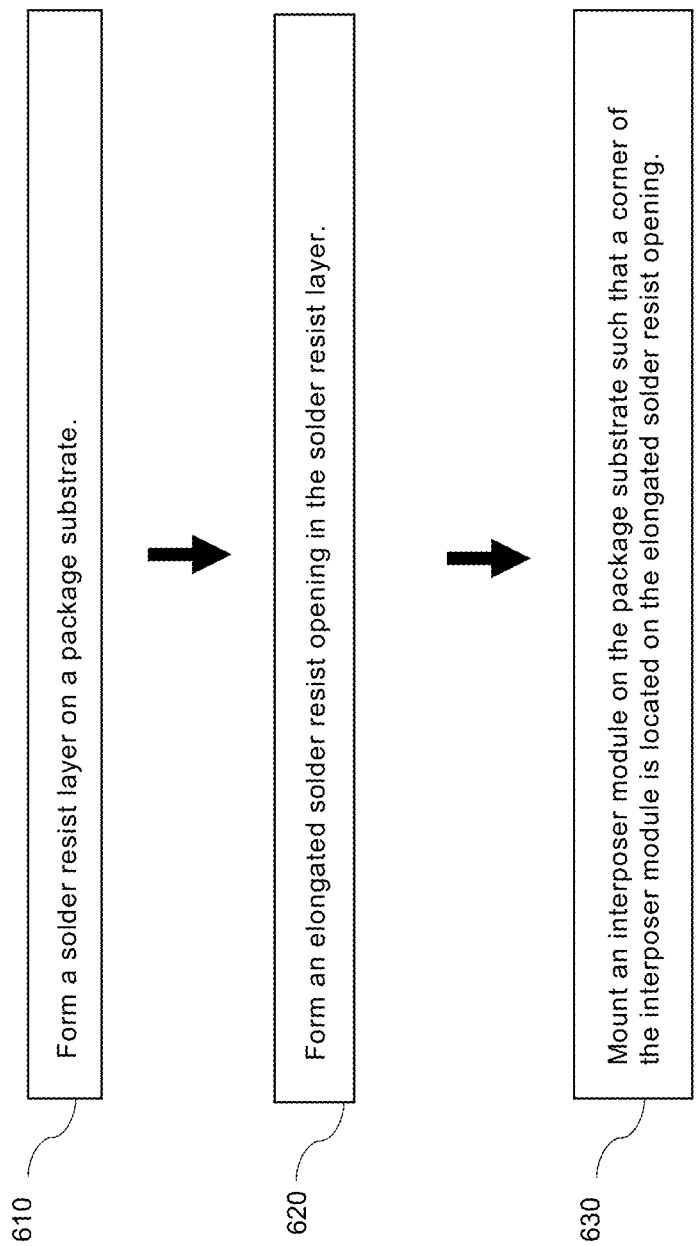
FIG. 6 is a flow chart illustrating a method of making a package assembly according to one or more embodiments.

FIG. 6 is a flow chart illustrating a method of making a package assembly according to one or more embodiments. Step 610 includes forming a solder resist layer on a package substrate. Step 620 includes forming an elongated solder resist opening in the solder resist layer. Step 630 includes mounting an interposer module on the package substrate such that a corner of the interposer module is located on the elongated solder resist opening.

Referring to FIGS. 1A-6, a package assembly 100, may include a package substrate 100, a solder resist layer 115 on the package substrate 100 and including an elongated solder resist opening 115a-1, and an interposer module 120 on the package substrate 110 and including a corner located on the elongated solder resist opening 115a-1. The elongated solder resist opening 115a-1 may include a first end having a first width $W1_{SRO}$, and a second end opposite the first end and having a second width $W2_{SRO}$ greater than the first width $W1_{SRO}$. The interposer module 120 may include an outer edge and the second end $W2_{SRO}$ of the elongated solder resist opening 115a-1 may be located closer to the outer edge than the first end of the elongated solder resist opening 115a-1. A longitudinal direction of the elongated solder resist opening 115a-1 may intersect the corner of the interposer module 120 in a plan view. The package substrate 110 may include a first package substrate bonding pad 110a-1 and the elongated solder resist opening 115a-1 may be located over the first package substrate bonding pad 110a-1. The solder resist layer 115 further may include a circular solder resist opening 115a-2 having a size that may be less than a size of the elongated solder resist opening 115a-1. The package substrate 110 may further include a second package substrate bonding pad 110a-2 having a size that may be less than a size of the first package substrate bonding pad 110a-1, the circular solder resist opening 115a-2 being located over the second package substrate bonding pad 110a-2. The circular solder resist opening 115a-2 may be located at a central portion of the interposer module 120. The package assembly 110 may further include a bump structure 121-1 in the elongated solder resist opening 115a-1 and connecting the interposer module 120 to the first package substrate bonding pad 110a-1. The bump structure 121-1 may include under bump metallization (UBM) 151 that contacts an interposer bonding pad 120 at the corner of the interposer module 120, and has a width $d_{UBM}$ that may be less than a length $L_{SRO}$ of the elongated solder resist opening 115a-1. The bump structure 121-1 further may include a solder joint 152-1 that connects the UBM 151 to the first package substrate bonding pad 110a-1. A longitudinal direction of the elongated solder resist 115a-1 opening may be parallel to a direction from a center of the interposer module 120 to a center of the UBM 151. The UBM 151 may include an elongated UBM 151 having a longitudinal direction that may be substantially aligned with a longitudinal direction of the elongated solder resist opening 115a-1. The elongated solder resist opening 115a-1 may include a plurality of elongated solder resist openings 115a, and the corner of the interposer module 120 may include a plurality of corners of the interposer module 120 located at the plurality of elongated solder resist openings 115a-1, respectively.

A method of forming a package assembly 100 may include forming a solder resist layer 115 on a package substrate 110, forming an elongated solder resist opening 115a-1 in the solder resist layer 115, and mounting an interposer module 120 on the package substrate 110 such that a corner of the interposer module 120 may be located on the elongated solder resist opening 115a-1. The forming of the elongated solder resist opening 115a-1 may include forming a first end of the elongated solder resist opening 115a-1 having a first width $W1_{SRO}$, and forming a second end of the elongated solder resist opening 115a-1 opposite the first end, the second end of the elongated solder resist opening 115a-1 having a second width $W2_{SRO}$ greater than the first width $W1_{SRO}$. The method may further include forming a bump structure 121-1 in the elongated solder resist opening 115a-1 and connecting the interposer module 120 to a first package substrate bonding pad 110a-1 of the package substrate 110. The forming of the bump structure 121-1 may include forming under bump metallization (UBM) 151 that contacts an interposer bonding pad 158 at the corner of the interposer module 120, and has a width that may be less than a length of the elongated solder resist opening 115a-1. The forming of the bump structure 121-1 further may include forming a solder joint 152-1 that connects the UBM 151 to the first package substrate bonding pad 110a-1 through the elongated solder resist opening 115a-1. The forming of the elongated solder resist opening 115a-1 may include forming the elongated solder resist opening 115a-1 to have a longitudinal direction parallel to a direction from a center of the interposer module 120 to a center of the UBM 151. The forming of the solder joint 152-1 may include forming a pre-solder layer 153 on the first package substrate bonding pad 110a-1 so that the pre-solder layer 153 substantially fills the elongated solder resist opening 115a-1, forming a solder layer 154 on the under bump metallization (UBM) 151 the contacts the interposer bonding pad 158, and performing a reflow process so that the pre-solder layer 153 and the solder layer 154 combine to form the solder joint 121-1 that electrically connects the UBM 151 to the first package substrate bonding pad 110a-1 through the elongated solder resist opening 115a-1.

A semiconductor package 100 may include a package substrate 110 including a first package substrate contact pad 110a-1 and a second package substrate contact pad 110a-2 having a size that may be less than a size of the first package substrate contact pad 110a-1, a solder mask 115 on the package substrate 110 and including a first solder resist opening 115a-1 located over the first package substrate contact pad 110a-1 and having an elongated shape, the first solder resist opening 115a-1 including a first end having a first width $W1_{SRO}$ and a second end opposite the first end and having a second width $W2_{SRO}$ greater than the first width $W1_{SRO}$, and a second solder resist opening 115a-2 located over the second package substrate contact pad 110a-2 and having a circular shape, the second solder resist opening 115a-2 having a size that may be less than a size of the elongated solder resist opening 115a-1, an interposer module 120 mounted on the package substrate 110 and including a first interposer contact pad 158 located at a corner of the interposer module 120, and a second interposer contact pad 158 located at a central portion of the interposer module 120, and a plurality of bump structures 121 connecting the interposer module 120 to the package substrate 110, the plurality of bump structures 121 including a first bump structure 121-1 including a first under bump metallization (UBM) 151 contacting the first interposer contact pad 158, and a first solder joint 152-1 connecting the first UBM 151 to the first package substrate contact pad 110a-1 through the first solder resist opening 115a-1, and a second bump structure 121-2 including a second under bump metallization (UBM) 151 contacting the second interposer contact pad 158, and a second solder joint 152-2 having a size that may be less than a size of the first solder joint 152-1 and connecting the second UBM 151 to the second package substrate contact pad 110a-2 through the second solder resist opening 115a-2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package assembly, comprising:
   a package substrate;
   a solder resist layer on the package substrate, wherein the solder resist layer comprises an elongated solder resist opening including a first end having a first width, and a second end opposite the first end and having a second width greater than the first width; and
   an interposer module on the package substrate and including a corner located on the elongated solder resist opening.

2. The package assembly of claim 1, wherein the interposer module comprises an outer edge and the second end of the elongated solder resist opening is located closer to the outer edge than the first end of the elongated solder resist opening.

3. The package assembly of claim 1, wherein a longitudinal direction of the elongated solder resist opening intersects the corner of the interposer module in a plan view.

4. The package assembly of claim 1, wherein the package substrate comprises a first package substrate bonding pad and the elongated solder resist opening is located over the first package substrate bonding pad.

5. The package assembly of claim 4, wherein the solder resist layer further comprises a circular solder resist opening having a size that is less than a size of the elongated solder resist opening.

6. The package assembly of claim 5, wherein the package substrate further comprises a second package substrate bonding pad having a size that is less than a size of the first package substrate bonding pad, the circular solder resist opening being located over the second package substrate bonding pad.

7. The package assembly of claim 5, wherein the circular solder resist opening is located at a central portion of the interposer module.

8. The package assembly of claim 4, further comprising:
a bump structure in the elongated solder resist opening and connecting the interposer module to the first package substrate bonding pad.

9. The package assembly of claim 8, wherein the bump structure comprises:
under bump metallization (UBM) that contacts an interposer bonding pad at the corner of the interposer module, and has a width that is less than a length of the elongated solder resist opening; and
a solder joint that connects the UBM to the first package substrate bonding pad.

10. The package assembly of claim 9, wherein a longitudinal direction of the elongated solder resist opening is parallel to a direction from a center of the interposer module to a center of the UBM.

11. The package assembly of claim 9, wherein the UBM comprises an elongated UBM having a longitudinal direction that is substantially aligned with a longitudinal direction of the elongated solder resist opening.

12. The package assembly of claim 1, wherein the elongated solder resist opening comprises a plurality of elongated solder resist openings, and the corner of the interposer module comprises a plurality of corners of the interposer module located at the plurality of elongated solder resist openings, respectively.

13. The package assembly of claim 1, further comprising:
a bump structure including under bump metallization (UBM) connected to a contact pad of the interposer module and located over the elongated solder resist opening.

14. The package assembly of claim 13, wherein the bump structure further comprises a solder joint that connects the UBM to a bonding pad of the package substrate.

15. A method of forming a package assembly, comprising:
forming a solder resist layer on a package substrate;
forming an elongated solder resist opening in the solder resist layer, wherein the forming of the elongated solder resist opening comprises:
forming a first end of the elongated solder resist opening having a first width; and
forming a second end of the elongated solder resist opening opposite the first end, the second end of the elongated solder resist opening having a second width greater than the first width; and
mounting an interposer module on the package substrate such that a corner of the interposer module is located on the elongated solder resist opening.

16. The method of claim 15, further comprising:
forming a bump structure in the elongated solder resist opening and connecting the interposer module to a first package substrate bonding pad of the package substrate, the forming of the bump structure comprising:
forming under bump metallization (UBM) that contacts an interposer bonding pad at the corner of the interposer module, and has a width that is less than a length of the elongated solder resist opening; and
forming a solder joint that connects the UBM to the first package substrate bonding pad through the elongated solder resist opening.

17. The method of claim 16, wherein the forming of the elongated solder resist opening comprises forming the elongated solder resist opening to have a longitudinal direction parallel to a direction from a center of the interposer module to a center of the UBM.

18. The method of claim 17, wherein the forming of the solder joint comprises
forming a pre-solder layer on the first package substrate bonding pad so that the pre-solder layer substantially fills the elongated solder resist opening;
forming a solder layer on the under bump metallization (UBM) the contacts the interposer bonding pad; and
performing a reflow process so that the pre-solder layer and the solder layer combine to form the solder joint that electrically connects the UBM to the first package substrate bonding pad through the elongated solder resist opening.

19. A semiconductor package, comprising:
a package substrate;
a solder resist layer on the package substrate, wherein the solder resist layer comprises:
a first solder resist opening having an elongated shape and comprising a first end having a first width and a second end opposite the first end and having a second width greater than the first width; and
a second solder resist opening having a circular shape and having a size that is less than a size of the first solder resist opening;
an interposer module mounted on the package substrate; and
a plurality of bump structures connecting the interposer module to the package substrate, the plurality of bump structures comprising:
a first bump structure comprising a first under bump metallization (UBM) and a first solder joint connecting the first UBM to the package substrate through the first solder resist opening; and
a second bump structure comprising a second under bump metallization (UBM) and a second solder joint having a size that is less than a size of the first solder joint and connecting the second UBM to package substrate through the second solder resist opening.

20. The semiconductor package of claim 19, wherein the package substrate comprises a first package substrate contact pad and a second package substrate contact pad having a size that is less than a size of the first package substrate contact pad,
wherein the first solder resist opening is located over the first package substrate contact pad and the second solder resist opening is located over the second package substrate contact pad,
wherein the interposer module comprises a first interposer contact pad located at a corner of the interposer module, and a second interposer contact pad located at a central portion of the interposer module,
wherein the first UBM contacts the first interposer contact pad and the first solder joint connects the first UBM to the first package substrate contact pad, and
wherein the second UBM contacts the second interposer contact pad and the second solder joint connects the second UBM to the second package substrate contact pad.

* * * * *